(12) United States Patent
Maxey et al.

(10) Patent No.: US 10,716,341 B2
(45) Date of Patent: *Jul. 21, 2020

(54) FLEXIBLE CIRCUITS AND METHODS THEREFOR

(71) Applicant: LOOMIA Technologies, Inc., New York, NY (US)

(72) Inventors: Madison Thea Maxey, New York, NY (US); Ezgi Ucar, Istanbul (TR); Janett Martinez, Queens, NY (US)

(73) Assignee: LOOMIA Technologies, Inc., New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/920,536

(22) Filed: Mar. 14, 2018

(65) Prior Publication Data

US 2018/0279697 A1    Oct. 4, 2018

Related U.S. Application Data

(63) Continuation of application No. 15/276,670, filed on Sep. 26, 2016, now Pat. No. 10,051,898.
(Continued)

(51) Int. Cl.
*A41D 13/005* (2006.01)
*H05K 1/18* (2006.01)
(Continued)

(52) U.S. Cl.
CPC ......... *A41D 13/0051* (2013.01); *A41D 1/002* (2013.01); *A41D 1/04* (2013.01);
(Continued)

(58) Field of Classification Search
CPC ...... H05K 3/0058; H05K 1/167; H05K 1/038; H05K 3/303; H05K 3/061; H05K 1/0212;
(Continued)

(56) References Cited

U.S. PATENT DOCUMENTS 3,621,192 A    11/1971   Pohler
4,310,745 A    1/1982    Bender
(Continued)

FOREIGN PATENT DOCUMENTS

WO    2016/023027 A1    2/2016

*Primary Examiner* — Duy Vu N Deo
(74) *Attorney, Agent, or Firm* — Bookoff McAndrews, PLLC

(57) ABSTRACT

One variation of a method for fabricating a garment includes: applying a first mask to a first side of a fabric substrate coated with a conductive material; applying a second mask—mirrored image of the first mask—to a second side of the fabric substrate opposite the first side; applying an etchant to the fabric substrate to remove conductive material outside of the first mask; arranging a conductive interface pad of a component carrier over an electrode defined by remaining conductive material on the fabric substrate, the component carrier including a flexible substrate and a rigid electrical component mounted to the flexible substrate, the conductive interface pad extending from a terminal of the rigid electrical component across a region of the flexible substrate; mechanically fastening the component carrier to the fabric substrate to form a garment insert including an electrical circuit; and incorporating the garment insert into the garment.

9 Claims, 8 Drawing Sheets

Related U.S. Application Data

(60) Provisional application No. 62/232,217, filed on Sep. 24, 2015, provisional application No. 62/253,826, filed on Nov. 11, 2015, provisional application No. 62/263,456, filed on Dec. 4, 2015, provisional application No. 62/338,251, filed on May 18, 2016.

(51) Int. Cl.
| | |
|---|---|
| *H05K 1/02* | (2006.01) |
| *H05B 3/34* | (2006.01) |
| *A41H 43/04* | (2006.01) |
| *A41D 1/00* | (2018.01) |
| *H05K 3/00* | (2006.01) |
| *H05K 1/16* | (2006.01) |
| *A41D 1/04* | (2006.01) |
| *A41D 1/22* | (2018.01) |
| *H05B 1/02* | (2006.01) |
| *H05K 1/03* | (2006.01) |
| *H05K 3/06* | (2006.01) |
| *H05K 3/30* | (2006.01) |
| *H05K 1/11* | (2006.01) |
| *H05K 1/09* | (2006.01) |
| *H05K 3/12* | (2006.01) |
| *H05K 3/28* | (2006.01) |

(52) U.S. Cl.
CPC ............... *A41D 1/22* (2013.01); *A41H 43/04* (2013.01); *H05B 1/0272* (2013.01); *H05B 3/347* (2013.01); *H05K 1/0212* (2013.01); *H05K 1/038* (2013.01); *H05K 1/167* (2013.01); *H05K 1/181* (2013.01); *H05K 3/0058* (2013.01); *H05K 3/061* (2013.01); *H05K 3/303* (2013.01); *A41D 2400/12* (2013.01); *H05B 2203/017* (2013.01); *H05B 2203/036* (2013.01); *H05K 1/092* (2013.01); *H05K 1/111* (2013.01); *H05K 1/189* (2013.01); *H05K 3/1241* (2013.01); *H05K 3/282* (2013.01); *H05K 2201/10098* (2013.01); *H05K 2201/10106* (2013.01); *H05K 2201/10151* (2013.01)

(58) Field of Classification Search
CPC .................. H05K 1/181; H05K 3/282; H05K 2201/10098; H05K 2201/10106; H05K 2201/10151; H05K 3/1241; H05K 1/111; H05K 1/189; H05K 1/092; A41D 1/04; A41D 1/22; A41D 1/002; A41D 2400/12; H05B 1/0272; H05B 3/347; H05B 2203/036; H05B 2203/017; A41H 43/04

See application file for complete search history.

(56) References Cited

U.S. PATENT DOCUMENTS

| | | |
|---|---|---|
| 4,591,701 A | 5/1986 | Tokumaru |
| 5,148,002 A | 9/1992 | Kuo et al. |
| 5,288,974 A | 2/1994 | Hanzic |
| 5,477,033 A | 12/1995 | Bergholtz |
| 5,977,517 A | 11/1999 | Grosjean |
| 6,729,025 B2 | 5/2004 | Farrell et al. |
| 7,115,844 B2 | 10/2006 | Ferguson |
| 7,320,947 B2 | 1/2008 | Child et al. |
| 7,461,444 B2 | 12/2008 | Deaett et al. |
| 7,559,902 B2 | 7/2009 | Ting et al. |
| 7,592,276 B2 | 9/2009 | Hill et al. |
| 7,777,156 B2 | 8/2010 | Rock et al. |
| 8,114,791 B2 | 2/2012 | Child et al. |
| 8,293,336 B2 | 10/2012 | Creamer et al. |
| 8,823,395 B2 | 9/2014 | Bhattacharya |
| 8,984,747 B2 | 3/2015 | Kim et al. |
| 9,386,684 B2 | 7/2016 | Sime et al. |
| 10,045,573 B2 * | 8/2018 | Maxey ............... A41D 13/0051 |
| 10,051,898 B2 * | 8/2018 | Maxey ............... A41D 13/0051 |
| 2005/0082280 A1 * | 4/2005 | Ferguson ............... A61F 7/007 219/528 |
| 2007/0049147 A1 | 3/2007 | Hill et al. |
| 2007/0154644 A1 | 7/2007 | Hwang et al. |
| 2008/0054408 A1 | 3/2008 | Tippey et al. |
| 2008/0109941 A1 | 5/2008 | Moreshead |
| 2009/0057290 A1 | 3/2009 | Williams |
| 2012/0118427 A1 | 5/2012 | Brookstein et al. |
| 2013/0176737 A1 | 7/2013 | Zhou et al. |
| 2014/0316495 A1 | 10/2014 | Augustine et al. |
| 2016/0205726 A1 | 7/2016 | Spielmann et al. |

* cited by examiner

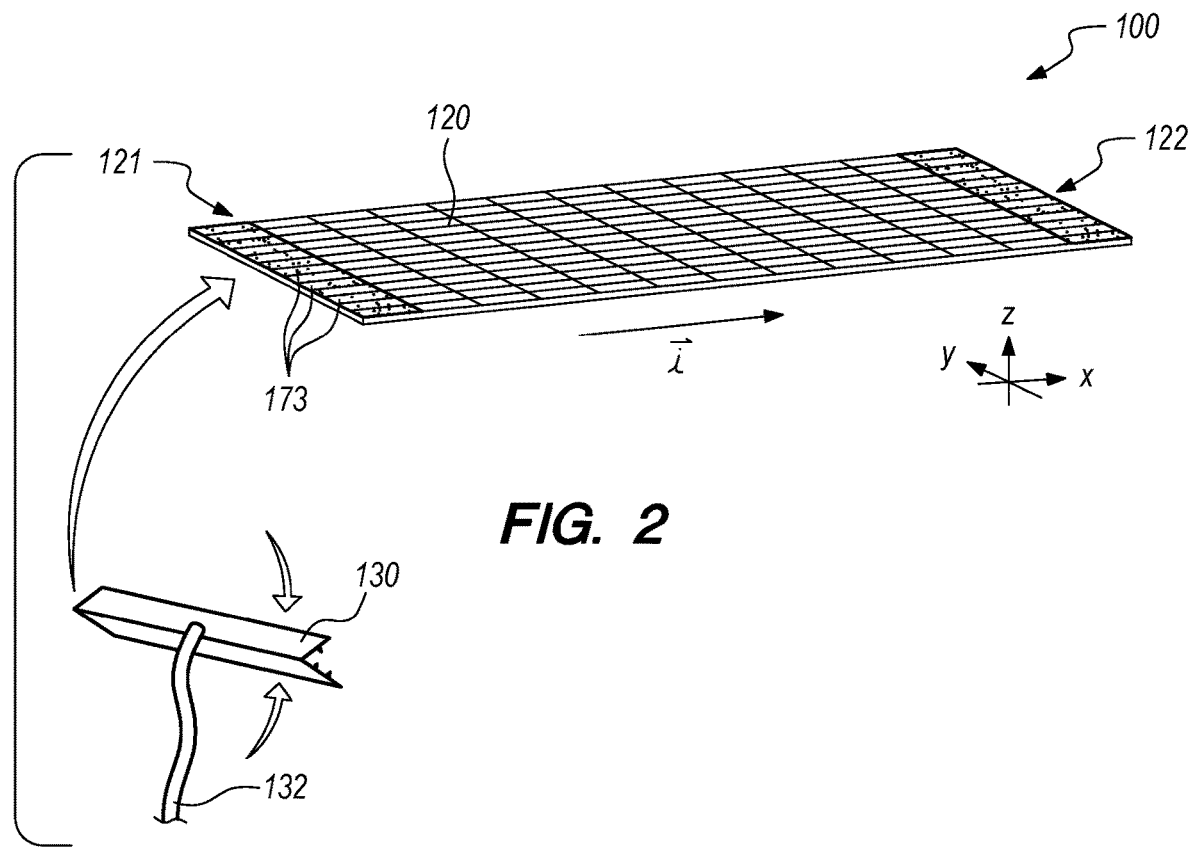
FIG. 2
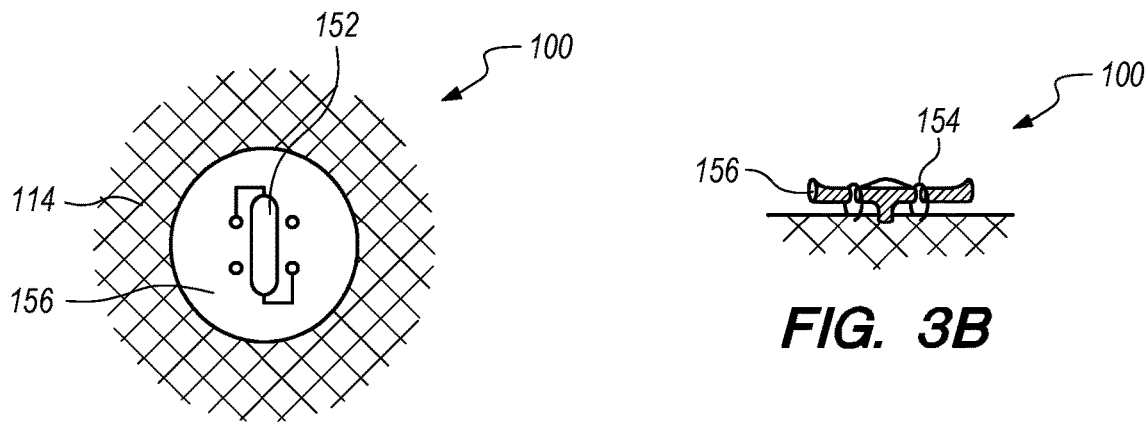
FIG. 3A
FIG. 3B

FLEXIBLE CIRCUITS AND METHODS THEREFOR

CROSS-REFERENCE TO RELATED APPLICATIONS

This Application is a continuation of U.S. application Ser. No. 15/276,670, filed Sep. 26, 2016, which claims the benefit of U.S. Provisional Application No. 62/232,217, filed Sep. 24, 2015, U.S. Provisional Application No. 62/253,826, filed Nov. 11, 2015, U.S. Provisional Application No. 62/263,456, filed Dec. 4, 2015, and U.S. Provisional Application No. 62/338,251, filed May 18, 2016, all of which are incorporated herein by reference in their entireties.

TECHNICAL FIELD

This invention relates generally to the field of garment manufacturing and more specifically to a new and useful system for heating a garment in the field of garment manufacturing.

BRIEF DESCRIPTION OF THE FIGURES

FIG. 2 is a flowchart representation of one variation of the system;

FIGS. 3A and 3B are schematic representations of one variation of the system.

DESCRIPTION OF THE EMBODIMENTS

The following description of embodiments of the invention is not intended to limit the invention to these embodiments but rather to enable a person skilled in the art to make and use this invention. Variations, configurations, implementations, example implementations, and examples described herein are optional and are not exclusive to the variations, configurations, implementations, example implementations, and examples they describe. The invention described herein can include any and all permutations of these variations, configurations, implementations, example implementations, and examples.

1. System

Figure 1:
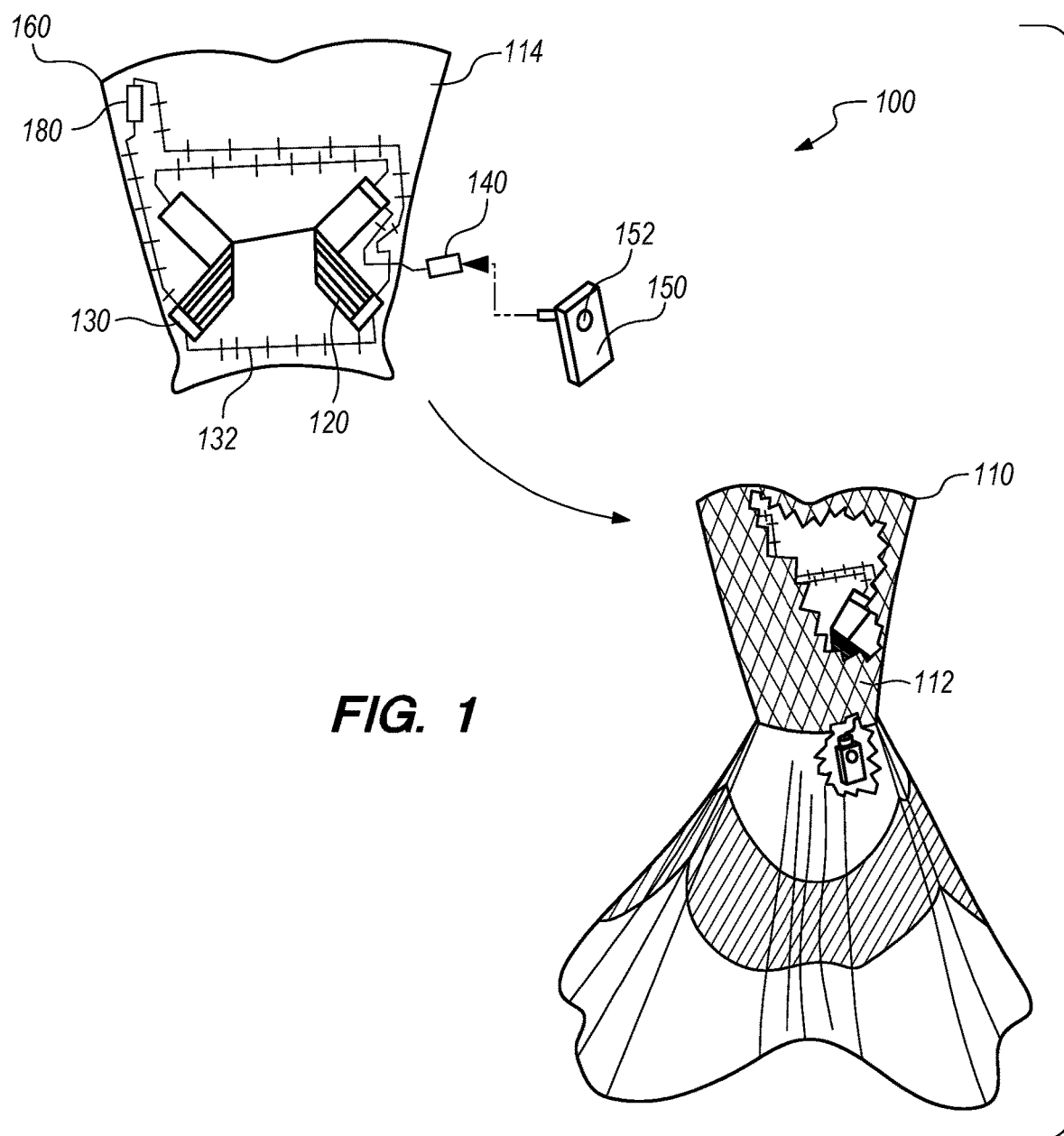
FIG. 1 is a flowchart representation of a system.

As shown in FIG. 1, a heated garment (hereinafter the system 100) includes: a garment 110 including an exterior fabric section 112 and a lining 114; a heating element 120 arranged over a first region 121 of the lining 114 and including an elongated woven textile, the elongated woven textile doped with conductive particulate 173 at a first end and at a second end; a metallic connector 130 arranged over the first end of the elongated woven textile and including a conductive lead 132 extending toward a power junction 140 in a second region 122 of the lining 114; and a power module 150 configured to transiently mount to the second region 122 of the lining 114, to transiently engage the power junction 140, and to intermittently supply current to the heating element 120 via the conductive lead 132 and the metallic connector 130.

One variation of the system 100 defines a kit including: a garment insert 160 configured for installation between an exterior fabric section 112 and an interior lining 114 of a garment; a heating element 120 mounted to a first region 121 of the garment insert 160 and including an elongated woven textile, the elongated woven textile doped with conductive particulate 173 at a first end and at a second end and characterized by a first impedance along a central axis from the first end to the second end; a metallic connector 130 crimped over the first end of the elongated woven textile and including a conductive lead 132 sewn onto the garment insert 160; a power junction 140 arranged over a second region 122 of the lining 114 and electrically coupled to the conductive lead 132; and a power module 150 configured to transiently coupled to the second region 122 of the garment insert 160, to transiently engage the power junction 140, and to intermittently supply current to the heating element 120 via the conductive lead 132 and the metallic conductor.

1.1 Applications

Generally, the system 100 is configured for integration or installation within a garment—such as a jacket, a dress, pants, or a blouse—to intermittently warm a user wearing the garment 110. The system 100 includes a power module 150 and a garment insert 160 and one or more heating elements, an input control 152, a temperature sensor 180, and/or connectors between various elements arranged on (e.g., sewn into) the garment insert 160. With the garment insert 160 installed or integrated into a garment, the power module 150 can be electrically coupled to the garment insert 160 to supply current to the heating elements.

The system 100 includes textile-based heating elements and flexible electronic connections and is configured for integration or installation into garments with standard textile production equipment and with substantially minimal (or no) electronics manufacturing equipment or processes. In particular, the system 100 can include textiles and clothing-type interfaces and controls that output heat, sense ambient conditions, and capture user inputs to set one or more operating parameters. Furthermore, elements within the system 100 can be assembled into a garment according to processes and materials standard or common in the textile and garment industries in order to preserve a feeling of clothing and fashion in the garment 110 rather than a feeling of technology.

1.2 Configurations

In a first configuration, the system 100 defines a complete subsystem ready for installation inside an exterior fabric section 112 of a garment, as shown in FIG. 1. For example, in this configuration: a lining 114 (e.g., a garment insert 160) of muslin can be cut to match the perimeter geometry of a center-back panel of a dress and a first button slit and a second button slit can be cut and sewn into the lower center of the lining 114; one heating element can be sewn directly onto the lining 114 with a running stitch at each of a left flank region, a right flank region, and a center collar region of the lining 114; and the heating elements can be connected in parallel to the first and second button slits via insulated wires and connectors sewn onto the lining 114. The complete lining and a power module 150—including buttons configured for installation into the button slits to communicate (e.g., conduct) current into the heating element 120 via the insulated wires and connectors—can then be supplied to a seamstress, and the seamstress can stitch the lining 114 behind a center-back panel of a dress during manufacture of the dress.

In another configuration, the system 100 includes a wired subsystem ready for arrangement on a lining or fabric section of a garment. For example, in this configuration: a pair of connectors and a conductive lead 132 can be sewn onto a non-conductive fabric carrier (e.g., a strip of muslin); the end of a heating element can be sewn, clamped, or adhered, etc. onto a connector on the fabric carrier; and a power junction 140 can be mounted on and electrically coupled to the conductive lead 132 on the fabric carrier. The fabric carrier-heating element assembly and a power module 150 can then be supplied to a low-volume garment manufacturer, and the garment 110 manufacturer can fold the fabric carrier-heating element into a desired profile and stitch the fabric carrier-heating element onto a lining or other fabric section of a jacket during manufacture of the jacket.

In yet another configuration, the system 100 is supplied to a high-volume garment manufacturer as a group of discrete heating elements, connectors, an input control 152, a power junction 140, and a power supply per garment unit. In this configuration, the garment 110 manufacture: stitches or bonds (e.g., with a flexible adhesive) the heating elements to a lining or other fabric section of a garment; rivets the power junction 140 onto the lining 114; stitches the input control 152 onto the lining 114; installs the metallic connectors between the heating elements, power junction 140, and input control 152; assembles the lining 114 and fabric sections to complete the garment 110; and supplies the garment 110 and the power supply to a retailer.

1.3 Heating Element

The system 100 includes a heating element including an elongated woven textile doped with conductive particulate 173 at a first end and at a second end and characterized by a first impedance along a central axis from the first end to the second end. Generally, the heating element 120 defines a flexible (e.g., fabric-like) resistance heating element configured to generate heat due to Joule heating as electric current is communicated from the power module 150 through the heating element 120.

In one implementation, the heating element 120 includes a woven carbon fiber panel, such as an elongated rectilinear strip of unidirectional or 2×2 twill weave of carbon fibers. In this implementation, the carbon fiber panel can define a first end and a second end that are transiently connected to corresponding terminals of a current source (e.g., a battery arranged within the power module 150), as described below. The carbon fiber panel can also include multiple, unbroken carbon fibers that extend from the first end to the second end of the heating element 120. The carbon fiber panel can therefore exhibit relatively high conductivity (i.e., low resistance) along the carbon fibers—that is, between the first end and the second end along an X-axis parallel to the continuous length of the fibers extending therebetween. However, the carbon fibers can exhibit relatively low off-axis conductivity such that the carbon fiber panel exhibits relatively high resistance along its Y-axis and Z-axis.

In the foregoing implementation, the carbon fiber panel can be doped with conductive particles to achieve a first impedance between the first end and the second end that is substantially identical (i.e., "matched") to the a second impedance of the current source in order to generate maximum heat wattage output of the heating element 120. For example, the heating element 120 can be impregnated with silver nanoparticles, such as by introducing silver nanoparticles suspended in a low-viscosity fluid to the carbon fiber panel within a vacuum environment, and silver nanoparticles can then be sealed within the heating element 120 by encasing both sides of the heating element 120 with an elastic polymer (e.g., latex). In another example, silver nanoparticles can be suspended in a solvent that is painted on one or both sides of the heating element 120; once (or as) the solvent evaporates, the heating element 120 can be painted, dipped, or sprayed with an elastic polymer to seal the silver nanoparticles within the heating element 120.

In the foregoing implementation, a target depth, concentration, thickness, and/or particulate size of conductive particles can be applied over or impregnated into the heating element 120 to achieve a target aggregate impedance between the first end and the second end of the heating element 120. For example, for a battery with an internal impedance between 38 and 40 milliohms and for a first heating element 2" wide, 10" long, and including a single woven layer of carbon fiber threads 0.060" thick, the full area of both broad sides of the heating element 120 can be impregnated with silver nanoparticles to a depth of 0.004" to achieve a target impedance of approximately 39 milliohms between the first and second ends of the heating element 120. In another example, for the same battery and for a second heating element 1" wide, 10" long, and including a single woven layer of carbon fiber threads 0.060" thick, the full area of both broad sides of the heating element 120 can be impregnated with silver nanoparticles to a depth of 0.004" to again achieve a target impedance of approximately 39 milliohms between the first and second ends of the heating element 120.

In the foregoing implementation, select regions of the heating element 120 can also be masked and conductive particles can be applied or impregnated into sections of the heating element 120 between masked regions to similarly achieve a target impedance between the first and second ends of the heating element 120. For example, conductive dopant can be applied or impregnated in discrete, parallel rows extending from the first end to the second end of the carbon fiber panel. The heating element 120 can also include multiple similar woven layers of carbon fibers that cooperate to achieve a lower total impedance between the first and second ends of the heating element 120.

Alternatively, the heating element 120 can include conductive threads (e.g., nylon thread impregnated with silver nanoparticles) woven or stitched through a non-conductive textile (e.g., muslin) backing. However, the heating element 120 can include a panel or sheet of any other conductive textile or flexible, conductive material. The heating element 120 can also be doped (e.g., impregnated, coated) with any other conductive material according to any other depth, thickness, concentration, or other parameters to achieve a target impedance (or target impedance range) across the heating element 120.

In one implementation, the first end of the heating element 120 is selectively doped (or doped to a greater depth, thickness, and/or concentration) with conductive material to achieve improved Z-axis conductivity at the first end. In particular, conductive particles coated or impregnated into the first end of the heating element 120 can conduct current from an adjacent connector (described below), along the Z-axis of the heating element 120, into adjacent carbon fibers; carbon fibers extending continuously from the first end to the second end can thus communicate current from the doped first end to the second end of the heating element 120.

In the foregoing implementation, conductive material impregnated partially or fully through the Z-height of the first end of the heating element 120 can form a conductive interface between an adjacent connector and longitudinal carbon fibers within the heating element 120 to achieve lower Z-axis resistance locally at the first end of the heating element 120. As described above, the first end of the heating element 120 can be coated or impregnated with conductive nanoparticles in a suspension of a curable or volatile material, such as silver nanoparticles suspended in a photocurable resin or silver nanoparticles mixed into a drying adhesive (e.g., silver nanoparticles mixed within solid rubber particles dissolved in a volatile solvent). The second end of a heating element can be similarly doped with conductive material to improve Z-axis conductivity between an adjacent and connected carbon fibers extending into the second end of the heating element 120.

However, the heating element 120 can include conductive fibers, threads, wires, strings, or yarns, etc. woven in any other pattern into a flexible textile or textile-like panel of any other suitable geometry. Select regions of the heating element 120 can also be doped with any other conductive material in any other suitable way to achieve a target X-axis impedance between the first and second ends of the heating element 120 and to achieve at least a threshold Z-axis conductivity adjacent one or more connectors. The system 100 can also include multiple substantially similar or dissimilar heating elements.

Furthermore, the system can include other electrical components fabricated via similar methods and techniques directly onto a textile substrate. For example, the system can include a resistor, capacitor, or inductor fabricated onto the textile substrate by depositing conductive material onto the textile substrate, as described above.

1.4 Connectors

The system 100 includes a set of metallic connectors 130 configured to connect the first and second ends of the heating element 120 to other components within the system 100, such as to ends of other heating elements or to the power junction 140. Generally, the metallic connector 130 defines an electrode configured to abut a conductive surface of the first (or second) end of the heating element 120 and to form a Z-axis electrical connection with the heating element 120. For example, the metallic connector 130 includes an electrically-conductive (e.g., metallic, copper) electrode connected to a conductive lead 132 (e.g., an insulated wire) and configured to mate with an end of the heating element 120 in order to communicate current into (or out of) the heating element 120. In this example, the metallic connector 130 can include two copper electrodes connected by (e.g., soldered to) a braided copper wire, and the metallic connector 130 can be installed in series between two heating elements. The metallic connector 130 can also exhibit a total X-axis impedance that differs substantially from (i.e., is substantially greater than or substantially less than) the internal impedance of the battery in the power module 150 in order to limit Joule heating across the metallic connector 130.

In the configuration in which the system 100 is supplied assembled, the metallic connector 130 can include an electrode bonded over a doped end (e.g., the first end, the second end) of the heating element 120 with a flexible conductive adhesive. Alternatively, the electrode can be riveted to the electrode. Yet alternatively, the electrode can be perforated or can define a substantially thin (e.g., foil) structure and can be sewn directly onto the end of the heating element 120. In this configuration, once assembled, the metallic connector 130 and the end of the heating element 120 can be encased or overmolded with a non-conductive material, such as silicone or latex.

Alternatively, the metallic connector 130 can be crimped over the first (or second) end of the heating element 120. For example, as shown in FIG. 2, the metallic connector 130 can include a folded sheet metal structure defining in internal V-section configured to receive an end of the heating element 120. In this example, once the doped end of the heating element 120 is inserted into the internal V-section of the metallic connector 130, the metallic connector 130 can be compressed (e.g., stamped, punched, or folded) to close the internal V-section, thereby pinching and retaining the end of the heating element 120. In this implementation, the metallic connector 130 can include one or more prongs (e.g., "teeth") proximal the distal end of one or both sides of the internal V-section, and the prongs can pierce the doped end of the heating element 120 to improve Z-axis conductivity between the metallic connector 130 and the heating element 120. By piercing the heating element 120, the prongs can also prevent the metallic connector 130 from sliding off of the end of the doped end of the heating element 120 if tensioned. For example, the metallic connector 130 can include multiple prongs along the breadth of each distal end of the internal V-section, wherein each tooth is angled toward the throat of the internal V-section to enable the doped end of the heating element 120 to be easily inserted into the metallic connector 130 but to prevent release of the heating element 120 when the metallic connector 130 and the heating element 120 are tensioned.

In for foregoing implementation, external surfaces of the folded sheet metal structure can be coated or overmolded within a non-conductive material, such as silicone or rubber, and the footprint of each side of the folded sheet metal structure can exceed the footprint of the adjacent doped end of the heating element 120 such that the metallic connector 130 fully covers the doped end of the heating element 120 when the heating element 120 and the metallic connector 130 are assembled.

Connectors as described in the foregoing implementation can be supplied to a garment manufacturer in a kit of components and can be connected to heating elements manually with a crimping tool or mallet or with relatively simple automated press rather than more complicated tools, tooling, or processes during manufacture of a garment.

However, the metallic connector 130 can be assembled or connected to an end of the heating element 120 in any other suitable way. As described above, the metallic connector 130 can also include a conductive lead 132 (e.g., a braided copper wire) welded, soldered, or otherwise attached to the electrode, and the conductive lead 132 can be connected at an opposite end to the power junction 140 or to a second (like) electrode. The metallic connector 130 can thus be arranged between the heating element 120 and the power module 150, or the metallic connector 130 can be arranged between the heating element 120 and a second heating element within the system 100.

1.5 Textile Backing

In one variation, the system 100 includes a textile backing sewn, clamped, or otherwise installed behind and configured to support the heating element 120 and the metallic connector 130. In one implementation, the system 100 includes a single textile lining (e.g., a muslin lining) onto which heating elements and connectors are sewn or bonded directly. In this implementation, the textile lining can be sewn directly into the seams of a garment.

In another implementation, the system 100 includes a single elongated textile backing strip of width slightly greater than the width of each heating element in the system 100. In this implementation, the heating elements and connectors are sewn or bonded in a linear arrangement along the backing strip. When installed in a garment, the backing strip—with heating elements and connectors—can be folded and/or gathered into a desired heater placement pattern for the garment 110, and edges of the backing strip—which extend beyond the edges of the heating element 120—can be sewn across an interior lining of the garment 110.

In yet another implementation, the system 100 includes multiple textile backings, wherein each backing is sewn between ends of a pair of adjacent heating elements and to the conductive lead 132 of a connector extending therebetween. A series of heating elements and textile backing interposed between adjacent heating elements can be sewn, bonded, or assembled in series to form a serial heater assembly. The serial heater assembly can then be installed in a garment, as described above.

However, the heating elements and/or connectors in the system 100 can be mounted onto one or more textile backings according to any other pattern or configuration.

1.6 Power Module

The system 100 includes a power module 150 configured to transiently mount to the garment 110 (e.g., to the second region 122 of the lining 114), to transiently engage the power junction 140, and to intermittently supply current to the heating element 120 via the metallic connector 130. Generally, the power module 150 includes a battery, a connector that interfaces with the power junction 140, and a high-current switch that intermittently closes a circuit between the battery and the power junction 140 to supply to the heating element 120(s) within the garment 110. For example, the power module 150 can include a rechargeable lithium-ion battery, an H-bridge power driver, a processor, and a connector (e.g., a plug receptacle) arranged within a housing. The power module 150 can also include a momentary switch, potentiometer, rheostat, or other input control 152 electrically coupled to the processor, and the processor can activate the power driver, deactivate the power driver, and/or modify a duty cycle of the power driver based on an input into the input control 152.

As described below, the power module 150 can be separated from the garment 110 at the power junction 140 in order to recharge the power module 150 and/or to wash or clean the garment 110. For example, the battery can be recharged through the metallic connector 130. Alternatively, the power module 150 can include an internal inductive charging circuit that recharges the battery when the power module 150 is placed on an indicative charging surface.

1.7 Temperature Sensor

In one variation, the system 100 further includes a temperature sensor 180 electrically coupled to the processor within the power module 150 and configured to output a signal corresponding to a local ambient temperature. In this variation, the processor within the power module 150 can deactivate the power driver when an output of the temperature sensor 180 indicates that the local ambient temperature exceeds a threshold temperature (e.g., 67° F.), such as a static temperature threshold, a dynamic temperature that varied inversely with local humidity (as determined from a humidity sensor integrated into the garment 110 or into the power module 150), or a custom temperature threshold set by the user. The processor can therefore sample the temperature sensor 180 during operation and modify the output of the power module 150 substantially in real-time, such as to cease heating within the garment 110 when the user enters a temperature-controlled building or to increase heating within the garment 110 when the ambient temperature drops (and rain starts to fall). The processor can also dynamically modify the duty cycle of the power driver inversely with the local ambient temperature detected by the temperature sensor 180 (and/or proportionally with ambient humidity).

In one implementation, the temperature sensor 180 is integrated into the power module 150. Alternatively, the temperature sensor 180 can be water-proof (or water-resistant) or arranged within a water-proof housing and configured or arranged on or within the garment 110. For example, the temperature sensor 180 can be integrated into the garment 110 remotely from the heating element 120, such as sewn over the exterior fabric section 112 of the garment 110, onto the inside of the outer fabric layer of the garment 110, or a textile backing or lining onto which the heating element 120 is mounted. In this example, the temperature sensor 180 can be arranged near a shoulder of the garment 110, near the upper chest of the garment 110, or on a lapel of the garment 110 such that the temperature sensor 180 experiences minimal heating by the heating element 120 or the user, thereby yielding an output more representative of the ambient temperature. A ground channel and sense leads can also be wired from the temperature sensor 180 to the power junction 140. For example, the ground and sense leads can be sewn onto the lining 114 supporting the heating element 120 or into a seam within the garment 110. When the power module 150 is connected to the power junction 140, the processor can thus sample the sense channel over time during operation and modify the output of the power driver accordingly, as described above.

1.8 Input Controls

As described above, the power module 150 can include an integrated input control 152—such as a momentary button, a switch, or a potentiometer—that a user can manipulate to adjust a thermal output of the system 100. Alternatively, the system 100 can include a discrete input control 152 configured to integrate into the garment 110 directly (i.e., rather than into the power module 150).

In one implementation, the system 100 includes a zipper potentiometer wired to a power lead and to a sense lead connected to the power junction 140 and configured to be sewn onto the exterior fabric section 112 of the garment 110. In this implementation, the zipper potentiometer includes a slider head that rides along two interlocking columns of conductive (e.g., brass) teeth, wherein a first column is electrically connected to the power lead and a second column is connected to the sense lead. The zipper potentiometer can exhibit a resistance across the interlocking columns as a function of the position of the slider head along the column. In this implementation, the processor can read the resistance across the zipper potentiometer by applying a voltage to the power lead and then reading the voltage output at the sense lead. For example, for the battery that exhibits a varying voltage under different load conditions and charge states, the positive terminal of the battery can be electrically coupled to a first column of the zipper potentiometer (via the power junction 140) and to the non-inverting input of a differential op-amp arranged within the power module 150; and the second column of the zipper potentiometer is electrically coupled to the inverting side of the differential op-amp. In this example, the processor reads the output of the differential op-amp via an internal A/D converter and then supplies power to the heating elements at a rate proportional to the voltage output by the op-amp (e.g., inversely proportional to the resistance across the zipper potentiometer). For example, the processor can adjust the duty cycle of a digital PWM signal output to the power driver from 0% to 100% based on the resistance across the zipper potentiometer from a maximum resistance to a minimum resistance, respectively.

In the foregoing implementation, the zipper potentiometer can be a zipper sewn over a pocket on the garment 110 and can thus function to both close the pocket and to set the power output of the system 100. Alternatively the zipper potentiometer can be sewn over a continuous textile region of the garment 110 (i.e., over a region of the garment 110 excluding a pocket).

In another implementation, the system 100 includes an input control 152 integrated into a clothing button 156 configured for assembly onto the garment 110, as shown in FIGS. 3A and 3B. For example, the input control 152 can include a clothing button 156 including a momentary switch and configured to be stitched onto the garment 110 with conductive thread 154. For example, in the configuration in which the heating elements are assembled onto a lining (or backing), the lining 114 can include a pair of adjacent regions doped with a conductive material or stitching with a conductive thread 154 extending to the power junction 140, and the clothing button 156 can be mounted onto the garment 110 with two separate and discrete conductive threads passing through the exterior fabric section 112 of the garment 110 and through corresponding conductive regions on the lining 114. Thus, with the garment 110 assembled and the power module 150 connected to the power junction 140, the processor can index through multiple power settings— such as off, low heat, medium heat, and high heat—in response to depression of the momentary switch on the single clothing button 156.

In the foregoing implementations, the power module 150 can also include a haptic feedback module (e.g., a vibrator), and the processor can actuate the haptic feedback module in response to an input on the clothing button 156 or in response to a change in the position of the zipper potentiometer in order to indicate the mode or power setting currently executed by the system 100. For example, the processor can trigger the haptic feedback module to output one short pulse to indicate that the system 100 is in low heat mode, two short pulses to indicate that the system 100 is in medium heat mode, three short pulses to indicate that the system 100 is in high heat mode, one long pulse to indicate that the system 100 has turned on, and two long pulses to indicate that the system 100 has turned off.

Alternatively, one or more input controls can be integrated directly into the power module 150, such as in the form of a momentary switch or a rheostat, as described above. However, the system 100 can include any other type of input control 152 or combination of inputs controls of the same of different types. For example, the system 100 can include a clothing button 156-type input control 152 to turn the processor ON and OFF and a zipper potentiometer to set the output power of the system 100 when ON.

1.9 Power Junction

The power junction 140 functions to transiently connect analog power and/or logic-level digital channels in the power module 150 to corresponding channels (e.g., heating elements, sensors) in the garment 110. In one example, the power junction 140 is mounted to the garment insert 160 or backing within or near a side or breast pocket in the garment 110 in order to hide the power module 150 within the garment 110 and in order to enable a user to relatively easily install and remove the power module 150 from the power junction 140. However, the power junction 140 can be arranged on the lining 114 or within the garment 110 in any other suitable position.

1.9.1 Plug and Receptacle

In one implementation, the power junction 140 includes a female receptacle electrically connected to the heating element 120, the input controls, etc. and configured to engage a corresponding male plug on the power module 150, as shown in FIG. 1. For example, for the configuration described above in which the input controls and the temperature sensor 180 are arranged in the power module 150, the power junction 140 can include a two-channel ⅛" headphone jack including a power channel and a ground channel. In another example, in which the input control 152 (or the temperature sensor 180) is arranged in the garment 110, the power junction 140 can include a four-channel jack including: a voltage-variable power channel; a common ground channel; a low-current constant voltage supply channel; and a digital or analog input channel from the input control 152. In this implementation, the power junction 140 can include additional channels, such as for a remote temperature sensor 180, additional input controls (e.g., a second button), etc. arranged in or on the garment 110.

In the foregoing implementation, the power junction 140 can be mounted directly to the garment 110, such as to the garment insert 160, via a stitch, a rivet, an adhesive, or any other fastener. Alternatively, the power junction 140 can be attached to a cable extending from the garment 110.

Furthermore, in this implementation, the power module 150 can include a male plug configured to transiently (i.e., removably) engage the female receptacle. For example, the power module 150 can be removed from the power junction 140 when the garment 110 is laundered. The power junction 140 can also include a polymer sleeve that seals over the female receptacle when the male plug is removed from the female receptacle but that deforms around the male plug when the male plug is inserted into the female receptacle. For example, the power junction 140 can include a polymer sleeve defining a slit over the open end of the female receptacle, and the user can pinch the polymer sleeve to open the slit and then insert the male plug on the power module 150 into the female receptacle. In another example, the male plug (or female receptacle) can include a ferrous material, and the female receptacle (or male plug) can include a magnetic element configured to transiently mate with and retain the male plug (or vice versa). In this example, the magnetic female receptacle can be sewn directly into the garment and can interface with the male plug extending from the power module 150 when the garment 110 is in use.

1.9.2 Snap Buttons

In another implementation, the system 100 includes a set of conductive (e.g., metal) snaps that transiently couple the power module 150 to the garment 110 and communicate power and/or logic-level electrical signals between the power module 150 and heating elements, sensors, and/or input controls, etc. in the garment 110. In this implementation, the system 100 can include one snap button per I/O channel in the garment 110, such as one snap button each of: a high-current power supply channel for powering the heating elements; a common ground channel; low-current voltage supply channel for supplying power to a temperature sensor 180 and to a momentary switch; a first digital I/O channel for sensing outputs of the temperature sensor 180; and a first digital I/O channel for sensing outputs of the momentary switch.

In one implementation, each snap includes one male snap button end extending from the power module 150 and one female snap button end mounted on (e.g., riveted to) the garment 110 (or vice versa) per snap. The male snap button ends can be: riveted, soldered, or otherwise mounted directly to a PCB within the power module 150; mounted externally on the power module 150 housing and wired to an internal PCB; or otherwise electrically coupled to power and logic level I/O channels within the power module 150. The female snap button ends can be riveted through the interior lining, garment insert 160, and/or exterior fabric section 112 in the garment 110 with metallic (or otherwise electrically conductive) rivets. A female snap button end can also be riveted directly through a heating element, such as through a metal foil wrapped around a doped end of the heating element 120. Alternatively, the female snap button ends can be riveted through a metallic connector, as described above, including leads configured to extend to and to electrically couple to a heating element, an input control 152, and/or a sensor, etc. sewn into the garment 110. Yet alternatively, the garment 110 can include conductive thread sewn into select regions of the garment insert 160 and extending to one or more heating elements, input controls, and/or sensors, and the female snap button ends can be riveted with conductive rivets, sewn with conductive thread, or otherwise mounted to the garment insert 160 over these select conductive regions. Similarly, the garment insert 160 can include select regions doped with conductive material, as described above, and each female button snap end can be mounted over and electrically coupled to one of the select conductive regions, which can then be coupled to one of a heating element, a sensor, or a ground plane within the garment 110 via a connector as described above.

In one example, the garment 110 includes a set of five female snap button ends arranged in a vertical column along the spine of the garment 110 adjacent and below the collar of the garment 110 and facing the interior of the garment 110. In this example, the power module 150 includes a set of five male snap button ends arranged in a column in a substantially similar pattern. To enable heating, sensing, and control functions in the garment 110, the user can install the power module 150 into the garment 110 by snapping the male snap button ends on the power module 150 into corresponding female snap button ends in the garment 110. The snap buttons can thus communication power and logic-level signals between the garment 110 and the power module 150. Furthermore, in this example, the power module 150: is arranged between the user and the garment 110 and is therefore not immediately visible; is supported near the user's shoulders, which may mitigate back strain from the additional weight of the power module 150; and is centered on the user's back, which may limit the power module 150's effect on how the garment 110 drapes over the user; and is supported relatively high on the user's back, which may enable the user to sit in a chair while wearing the garment 110 without the discomfort of sitting against the power module 150. However, the power module 150 can be mounted in any other position or location on garment, such as over a shoulder blade, in a side or breast pocket, etc.

For configurations of the garment 110 in which the power module 150 interfaces with elements within the garment 110 over three or more channels, the garment 110 can include a set of female snap button ends arranged in a linear or grid pattern with center-to-center distances between adjacent snap buttons varying across the set—and the power module 150 can include a set of male snap buttons arranged in a similar, mirrored pattern—such that the power module 150 can only be mounted to the garment 110 in one orientation.

1.9.3 Clothing Buttons

Figure 4:
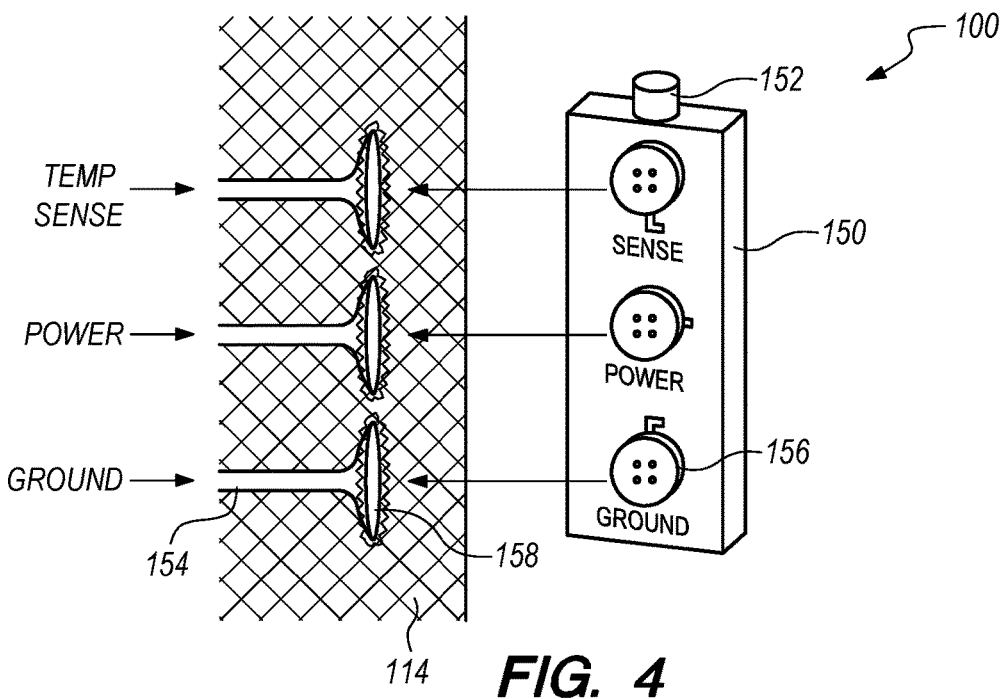
FIG. 4 is a schematic representation of one variation of the system.
Figure 5:
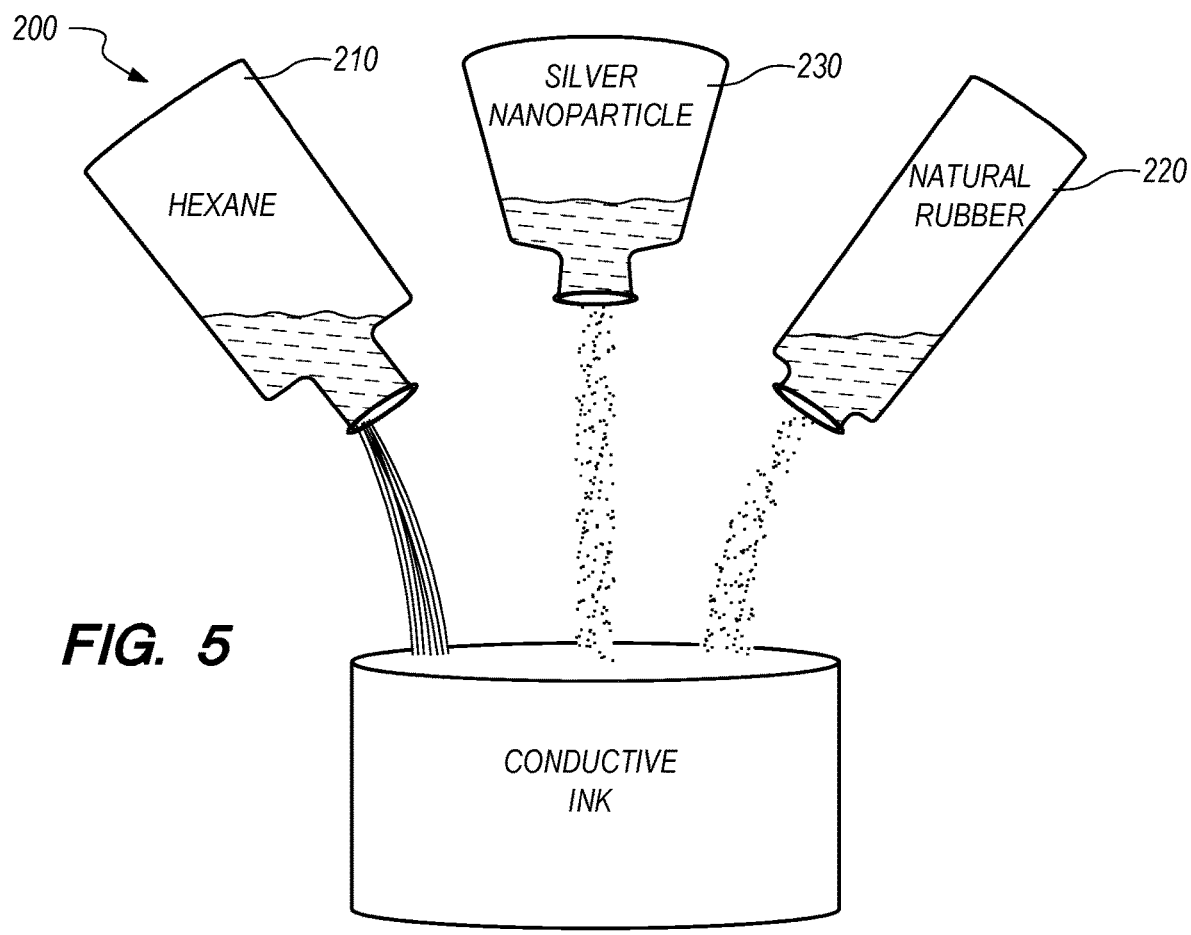
FIG. 5 is a schematic representation of a conductive ink.

In a similar implementation, the power module 150 can include a set of clothing buttons 156 mounted or fixed to a surface of the power module 150, and the garment 110 can include a series of slits 158, each configured to receive one clothing button 156 on the power module 150, as shown in FIG. 4. In this implementation, the power module 150 can include one discrete conductive trace behind each clothing button 156, and the garment 110 can include a conductive trace or conductive element (e.g., conductive thread) extending up to or around each slit 158. The power module 150 can therefore be installed on the garment 110 by inserting the clothing buttons 156 into the slits 158 in the garment 110, and the conductive traces on the power module 150 can thus contact corresponding conductive elements on the garment 110. Furthermore, in this implementation, the clothing buttons 156 on the power module 150 can be sprung toward their adjacent conductive traces. In particular, a particular clothing button 156 can be sprung toward the power module 150 such that, when inserted into a corresponding slit 158 in the garment 110, the particular button compresses adjacent garment material—including the adjacent conductive element—toward the corresponding conductive trace on the power module 150 to ensure consistent contact therebetween.

In this implementation, the buttons on the power module 150 and the corresponding slits 158 in the garment 110 can be arranged and can be coupled to elements within the garment 110 as in the foregoing implementation. Furthermore, in the foregoing implementations, the power module 150 can therefore be connected to the garment 110 via garment-type fasteners rather than common electronic type connectors. However, the power module 150 can be transiently (i.e., removably) installed on or within the garment 110 in any other way and in any other configuration or position, and channels within the power module 150 can be transiently electrically coupled to channels within the garment 110 in any other suitable way. The system 100 described above can also be mirrored or combined, such as by including female snap button ends on the power module 150 and a male snap button end on the garment 110, both male and female snap button ends on the power module 150 and the garment 110, or both snap buttons and clothing button 156-slit pairs on the power module 150 and garment.

1.9.4 Interface Protocols

In the foregoing implementations, when the power module 150 is connected to the garment 110, the power module 150 can test each channel in the garment 110 with logic-level voltage and current signals in order to identify power supply limitations for each channel before supplying higher-voltage or higher-current signals to the garment 110. For example, on startup (e.g., when first (re)installed in the garment 110 or powered on by the user), the power module 150 can: lock a ground channel to ground; test the resistance of each other channel through to ground; access a lookup specifying resistance ranges acceptable for each channel (e.g., a resistance value matched to the battery ±10% for the heating elements, infinite resistance for the momentary switch, etc.); begin supplying current to the heating element 120 channel (s) if the resistance for each channel tests within the specified range; and throw a flag if the resistance for one or more channels tests outside of the specified range. In this example, the power module 150 can issue an audible or visual warning locally—such as through a buzzer or LED integrated into the power module 150—in order to indicate to the user that the power module 150 is incorrectly installed in the garment 110. Alternatively, on start up, the power module 150 can test the resistances (or inductances, etc.) between various combinations of channel pairs, transform these resistance values into a pin-out map, and reconfigure connections between the male snap button ends and I/O ports on an internal controller, the battery, etc. However, the power module 150 can implement any other suitable method or technique to test each channel for proper connection In another example, the system 100 can include a preloaded ID chip arranged in the garment 110 and connected to a dedicated female snap button end on the garment 110. In this example, when the power module 150 is connected to the garment 110 by mating male snap button ends in the power module 150 with corresponding female snap button ends on the garment 110 or when the power module 150 is powered ON, the power module 150 can read the ID chip—via the corresponding snap button—to determine that the power module 150 is correctly installed in the garment 110. In this example, the power module 150 can also identify the make or model of the garment 110 and then retrieve (e.g., from local memory) and implement a heating model (e.g., a closed-loop feedback, duty cycle parameters, etc.) specific to the make or model of the garment 110 based on the identification data received from the ID chip in the garment 110. In particular, in this example, the power module 150 can be configured for installation on any number of garments, such as various jackets, pants, socks, scarves, hats, etc., each associated with different heating and temperature monitoring parameters and each including an ID chip preloaded with a digital identifier; the power module 150 can therefore read a digital identifier from an ID chip in a connected garment and automatically reconfigure itself to interface with the connected garment.

However, the power module 150 can implement any other suitable method or technique to identify and to interface with the garment 110.

2. Conductive Ink

As shown in FIG. 4, a conductive ink 210 includes: a volume of volatile solvent 210; a volume of conductive particulate 230 contained in the volume of volatile solvent 210; and polymer particles 220 dissolved in the volume of volatile solvent 210.

2.1 Applications

The conductive ink 200 includes: a volatile solvent 210; and conductive particulate 230 and polymer particles 220 in solution or in suspension in the volatile solvent 210. Generally, the conductive ink 200 can be deposited in liquid form—such as in the form of a bead, line, or pad—onto a section of fabric to form a conductive electrode, trace, or pad within of electrical circuit. As the solvent 210 evaporates, the polymer particles 220 congeal around the conductive particulate 230 to form a polymer-based, flexible, conductive structure. For example, when initially deposited onto a fabric section, the conductive ink 200 can contain equal parts of solvent 210, conductive particulate 230, and polymer particles 220. Once the solvent 210 has fully evaporated from the conductive ink 200 (i.e., once the conductive ink 200 has cured), the conductive ink 200 can contain equal parts conductive particulate 230 and polymer particles 220.

The conductive particulate 230 can include conductive metallic nanoparticles, such a silver nanoparticles or copper nanoparticles. Alternatively, the conductive particulate 230 can include conductive carbon nanotubes or any other suitable type of conductive particulate 230, particle, or powder.

The polymer particles 220 can include rubber particles—such as natural or synthetic non-vulcanized rubber microparticles—that dissolve in the solvent 210 to form an emulsion. Once the conductive ink 200 is deposited onto a surface (e.g., onto a textile) and the solvent 210 begins to evaporate, the polymer particles 220 can harden around the conductive particulate 230 to form a flexible conductive structure. Furthermore, as the solvent 210 evaporates, the polymer particles 220 can also bond to the adjacent surface, such as chemically or mechanically by forming around threads in the fabric.

The polymer particles 220 can be hydrophobic and water-resistant such that an assembly of fabric and conductive ink 200 traces can be washed—such as by dry cleaning or in a commercial or residential washing machine—without substantial impart to the size, shape, and conductivity of conductive ink 200 traces. In particular, the polymer particles 220 may not be dissolvable in water such that cured conductive ink 200 does not wash out of a fabric when exposed to water. Once dry and hardened (i.e., "cured," such as by drying over time or by heating), the polymer particles 220 can also encase conductive particulate 230 to minimize oxidation of the conductive particulate 230 over time, such as when the fabric is exposed to moist air or water during use. However, the polymer particles 220 can be of any other suitable type of polymer.

The solvent 210 can include hexane or any other suitable type of solvent capable of dissolving the polymer particles 220 and volatile in an environment suitable for a textile (e.g., at or near room temperature, at or near sea-level pressure). Generally, the solvent 210 functions to dissolve the polymer particles 220 to form an emulsion (e.g., an aqueous medium) in which conductive particulate 230 is supported and that can be dispensed onto a fabric or other surface. Once the conductive ink 200 is dispensed from a reservoir and thus exposed to a lower-pressure and/or higher-temperature environment outside of the reservoir, the solvent 210 evaporates from the emulsion, thus leaving the remaining polymer particles 220 to harden around the conductive particulate 230 and to form a contiguous, flexible structure (i.e., to "cure"). When the conductive ink 200 is dispensed onto a fabric, the solvent 210 can also function to activate (e.g., soften) an adjacent area of a the fabric, which may improve chemical and/or mechanical bonding between the activated area of the fabric and the polymer particulate in the conductive ink 200 as the solvent 210 evaporates. As conductive ink 200 in liquid form meets the surface of a fabric, the solvent 210 can also clean dirt, oils, and other debris from a local surface of the fabric, thereby preparing the fabric to bond to the polymer particles 220 as the conductive ink 200 cures. However, the solvent 210 can include any other suitable type of solvent and can function in any other way to dissolve polymer particle, to activate or clean a fabric, and to evaporate, thereby leaving the conductive particulate 230 and the polymer particles 220 to bond to the fabric in the form of a trace layout in an electrical circuit.

3. Ink Deposition System and First Method

Figure 7:
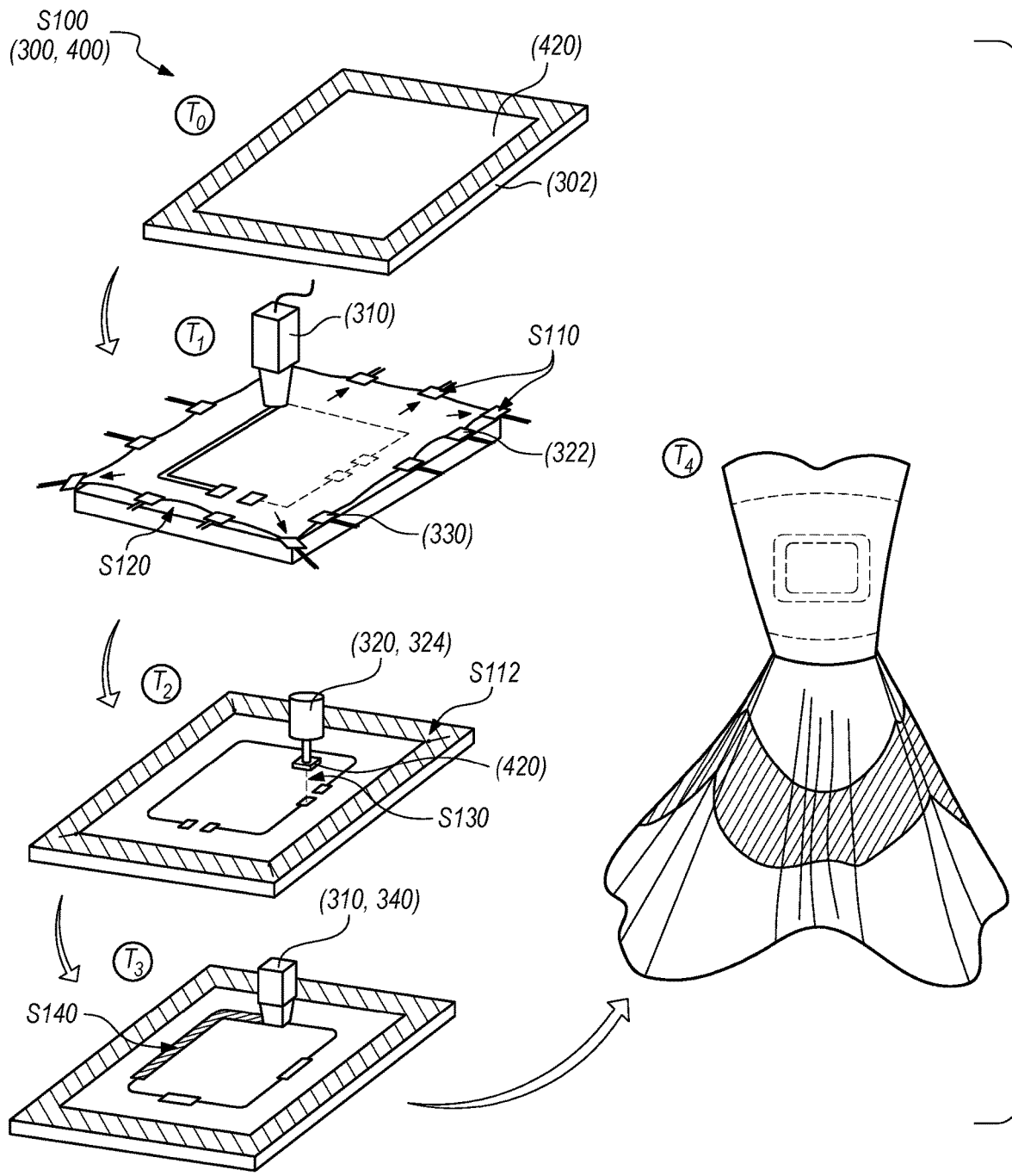
FIG. 7 is a flowchart representation of a first method.

As shown in FIG. 7, a first method S100 for manufacturing electrical circuits on textiles includes: at a first time, depositing a volume of conductive ink on a surface of a fabric section according to a trace layout defining a trace break in Block S120; at a second time succeeding the first time by a duration less than a drying period of the volume of conductive ink, setting an electrical component in the volume of conductive ink and across the trace break in Block S130; and, at a third time succeeding the second time, depositing a volume of nonconductive sealant over the volume of conductive ink in Block S140.

One variation of the first method S100 includes: tensioning a fabric section in a first direction in Block S110; at a first time, depositing a volume of conductive ink on a surface of the fabric section according to a trace layout in Block S120; at a second time succeeding the first time by a duration corresponding to a drying period of the volume of conductive ink, releasing the fabric section in Block S112; and depositing a volume of nonconductive sealant over the volume of conductive ink in Block S140.

Figure 6:
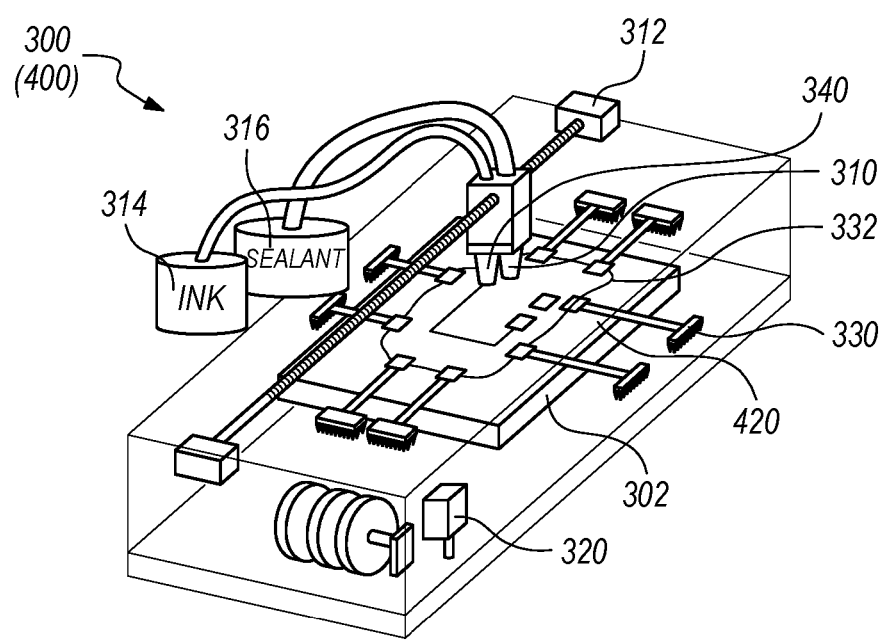
FIG. 6 is a schematic representation of an ink deposition system.

As shown in FIG. 6, an ink deposition system 300 can include: an extruder 310 configured to dispense conductive ink onto fabric sections; a component placement subsystem 320 configured to place electrical components onto fabric sections; a set of fingers 332 configured to grasp and/or tension a fabric section; a trace former 340 configured to form a volume of deposited conductive ink into a trace of a particular height and/or width; a punch configured to remove material from fabric sections in preparation to receive conductive ink; and/or a surface activator subsystem configured to dispense a solvent onto a fabric section to locally activate regions of the fabric section in preparation to receive conductive ink, as described below.

3.1 Applications

Generally, the ink deposition system 300 functions to deposit conductive ink onto a textile according to the first method S100 to form traces of a flexible electric circuit directly on the textile. The ink deposition system 300 can also place electrical components, such as sensors, capacitors, resistors, switches, batteries, and/or other passive and active circuit components onto the textile to complete a flexible, textile-backed circuit. The textile (e.g., a "fabric," a "fabric section," or a "pattern piece") can then be formed into an electrified garment or other soft good. In particular, the textile—including conductive ink and electrical components, can be integrated into a garment as a single electrified and aesthetic layer or integrated into a two-layer garment as an inner lining. The ink deposition system 300 can therefore manufacture electrical circuits directly onto fabric suitable for single-layer or two-layer garments, thereby eliminating a need for a third electrified layer in a "smart" garment.

3.2 Ink Deposition

Block S120 of the first method S100 recites, at a first time, depositing a volume of conductive ink on a surface of a fabric section according to a trace layout defining a trace break. Generally, in Block S120, the ink deposition system 300 functions to deposit one or more lines of conductive ink onto a section of fabric according to a trace layout selected for the section of fabric. In one implementation, the ink deposition system 300 includes: a planar processing platform 302 on which a fabric section is processed; a conductive ink reservoir 314; an extruder 310 configured to dispense a stream of liquid conductive ink from the conductive ink reservoir 314 onto the fabric section placed on the processing platform 302; and an actuator subsystem 312 (e.g., a gantry, a multi-axis robotic arm, an X-Y table) configured to move the extruder 310 relative to the processing platform 302 according to a trace layout selected for the fabric section.

In the foregoing implementation, the extruder 310 can include a flow meter, a nozzle of variable diameter, a metering valve, a pump, and/or any other subsystem suitable to meter a volume flow rate out of the extruder 310. The ink deposition system 300 can thus control a flow rate of conductive ink through the extruder 310 to achieve a target cross-sectional area of each line (or "trace") of conductive ink deposited onto a fabric section. The ink deposition system 300 can also vary the width of the extruder nozzle in order to modify the width of a deposited line of conductive ink, and the ink deposition system 300 can vary a speed of the actuator subsystem 312 arranged between the processing platform 302 and the extruder 310 in order to control a local cross-sectional area of deposited line of conductive ink. In particular, the conductive ink can exhibit electrical conductivity that varies proportional to its cross-sectional area; the ink deposition system 300 can therefore manipulate one or more subsystem within or coupled to the extruder 310 to achieve target conductivity (and therefore electrical resistance) of local traces of conductive ink of deposited onto a fabric section.

Through the extruder 310, the ink deposition system 300 can deposit one or more discrete traces, electrodes, pads for electrical components, etc. of conductive ink of one or more widths and/or heights on a fabric section in Block S120. For example, the ink deposition system 300 can: open the extruder 310 to deposit ink and activate the actuator subsystem 312 to deposit a contiguous line of conductive ink; intermittently close the extruder 310 to form an break in a line of conductive suitable to receive an electrical component in Block S130; and raster the extruder 310 over an area of a fabric section to form an electrode. One or more batteries, sensors, actuators, passive circuit components, and/or active circuit components, etc. can then installed on (e.g., bonded to) the conductive ink traces to form a circuit on the fabric section, as in Block S130 described below.

3.3 Tensioning

One variation of the first method S100 includes Block S110, which recites tensioning a fabric section in a first direction. Generally, in Block S110, the ink deposition system 300 functions to tension (e.g., "stretch") a section of fabric in preparation to receive conductive ink. In this variation, the ink deposition system 300 can include a fabric tensioning subsystem 330 configured to maintain textile (fabric) sheet in a tensioned configuration while conductive ink is deposited onto the fabric section in order to expose opens in the fabric section into which conductive ink may wick before fully curing. In particular, by tensioning a fabric section before depositing conductive ink onto the fabric section, the ink deposition system 300 can achieve greater local surface contact between the fabric section and the conductive ink and therefore achieve improved local bonding between the fabric section and the conductive ink per unit volume of conductive ink deposited onto the fabric.

In one implementation, the ink deposition system 300 processes a bolt of fabric by sequentially tensioning and depositing conductive ink onto adjacent sections of fabric along the length of the bolt of fabric. In this implementation, the ink deposition system 300 can include: a first spool that supports an unprocessed bolt of fabric; a second spool longitudinally offset from the first spool opposite a processing platform 302 and configured to receive fabric from the first spool; and a set of fingers 332 arranged longitudinally along the processing platform 302, configured to transiently grasp fabric over the processing platform 302, and operable to laterally tension fabric over the processing platform 302. For example, the ink deposition system 300 can include a pair of longitudinal fingers on each side of the processing platform 302, substantially perpendicular to the spools, and including prongs extending downward to engage a local section of fabric near its perimeter when the fingers are closed.

In the foregoing implementation, both the first and second spools can be motorized and can cooperate to move the fabric and to tension local section of the fabric across the processing platform 302. Alternatively, the ink deposition system 300 can include a second set of fingers 332 arranged laterally over the processing platform 302 between the first and second spools, configured to transiently grasp fabric over the processing platform 302, and operable to longitudinally tension fabric over the processing platform 302. The ink deposition system 300 can therefore automatically tension a local section of fabric laterally and/or longitudinally in Block S110, deposit conductive ink onto the local section of fabric in in Block S120, release tension on the local section of fabric in Block S112 once the conductive ink is deposited, place electrical components onto the local section of fabric in Block S130, advance the rollers forward to expose an adjacent local section of the fabric, and then repeat this process until the bolt is fully processed. In this implementation, the ink deposition system 300 can deposit conductive ink according to one trace layout across multiple adjacent segments of fabric, deposit conductive ink according to one trace layout across a single segment of fabric, or deposit conductive ink in multiple similar or distinct trace layouts across a single segment of fabric.

In another implementation, the ink deposition system 300 processes a section of fabric following removal of the fabric section from a fabric bolt. In one example implementation, the ink deposition system 300: receives a single pattern piece cut to size; tensions the single pattern piece; deposits conductive ink, electrical components, and/or nonconductive sealant, etc. onto the single pattern piece; and then releases the single pattern piece to complete a pattern piece processing cycle. In this example implementation, the ink deposition system 300 can include an optical scanning subsystem configured to scan the processing platform 302, to identify the pattern piece (or multiple distinct pattern pieces) placed across the processing platform 302, and to set an origin location and orientation for a subsequent pattern piece processing cycle based on the detected position of the pattern piece on the processing platform 302; the ink deposition system 300 can then execute the pattern piece processing cycle based on the origin location and orientation set specifically for the detected pattern piece, such as by transforming a two-dimensional tension pattern, a two-dimensional trace layout, a component placement map, and a two-dimensional sealant pattern from a stock origin to the detected origin of the pattern piece. However, in this example, the ink deposition system 300 can implement any other optical, mechanical, capacitive, or other technique to detect a pattern piece placed on the processing platform 302 and to map a pattern piece processing cycle to the detected pattern piece.

In the foregoing example implementation, the ink deposition system 300 can also include a set of fingers 332 and a set of actuators configured to manipulate the fingers across in two dimensions across the processing platform 302 to grasp, tension, and release a pattern piece according to a pattern piece processing cycle, such as regardless of orientation of the pattern piece placed on the processing platform 302. In this example implementation, the ink deposition system 300 can detect a pattern piece placed on the processing platform 302, such as described above, and then reposition the fingers to grasp the pattern piece and to tension the pattern piece over its original position on the processing platform 302 according to the pattern piece processing cycle elected for pattern piece. Alternatively, the ink deposition system 300 can manipulate the fingers to automatically move the pattern piece to a default origin before executing the pattern piece processing cycle, as described below.

In another example implementation, the ink deposition system 300 can process a section of fabric containing regions designated for multiple pattern pieces, such as a (sub)set of pattern pieces for one garment or multiple pattern pieces of the same type and geometry. In this example implementation, the ink deposition system 300 can include: a set of longitudinal and/or lateral fingers; and a set of actuators that manipulate the fingers to grasp edges of a fabric section and then draw opposing fingers outwardly to tension the fabric section before conductive ink is deposited onto the fabric section.

However, the ink deposition system 300 can include any other suitable mechanism or subsystem configured to grasp or retain an edge of a section of fabric and to tension the section of fabric along one or more axes.

3.4 Tension Release

This variation of the first method S100 also includes Block S112, which recites, at a second time succeeding the first time by a duration corresponding to a drying period of the volume of conductive ink, releasing the fabric section. Generally, in Block S112, the ink deposition system 300 can release tension on a fabric section before deposited conductive ink is fully dry (i.e., "cured") in order to prevent permanent local deformation of the fabric section due to overabundance of conductive ink in opens within the fabric section once the conductive ink has hardened.

In the implementation described above in which the ink deposition system 300 receives a single pattern piece, the tensioning subsystem 330 can actuate various fingers to grasp the perimeter of the pattern piece, store the positions of the fingers at first contact with the pattern piece as an initial position set, and then draw the fingers toward the perimeter of the processing platform 302 by a preset offset distance from the initial position set in order to achieve a target tension in the pattern piece in Block S110. Then, within a period of time substantially less than a hardening time of the conductive ink, the extruder 310 can deposit conductive ink on the surface of the pattern piece according to a full trace layout designated for the pattern piece. Once the full trace layout of the conductive ink is deposited on the pattern piece and before the deposited conductive ink is sufficiently hardened, the tensioning subsystem 330 can return the fingers to their initial grasp positions according to the initial position set in Block S112, thereby releasing tension on the pattern piece.

In the foregoing implementation, the ink deposition system 300 can define an enclosed volume over the processing platform 302 and can include a cooling subsystem that modulates the ambient temperature over the processing platform 302 to control a hardening rate (or a cure rate) of the conductive ink. For example, the solvent in the conductive ink can evaporate at a rate proportional to local ambient temperature; the cooling subsystem within the ink deposition system 300 can therefore maintain a reduced temperature over the processing platform 302 (e.g., 40° F.) to lengthen the hardening time of conductive ink, such as in order to prevent deposited conductive ink from hardening in opens in a fabric section before tension on the fabric section is released. Similarly, the solvent in the conductive ink can evaporate at a rate inversely proportional to local ambient pressure; the ink deposition system 300 can therefore define a pressure vessel around the processing platform 302 and can include a pump that intermittently increases ambient pressure over the processing platform 302 to reduce evaporation of the solvent, thereby delaying hardening of deposited conductive ink until a pattern piece is untensioned. In this implementation, the ink deposition system 300 can also draw a vacuum on the pressure vessel to increase evaporation of solvent from deposited conductive ink once the pattern piece is untensioned.

In another implementation, the conductive ink can include a type and/or concentration of solvent sufficient to yield a conductive ink hardening time substantially greater than a time necessary to deposit a full trace layout on a pattern piece. In this implementation, the ink deposition system 300 can include a heating subsystem that elevates the local air temperature over the processing platform 302 to more rapidly evaporate the solvent and to harden deposited conductive ink once tension on the pattern piece is removed or reduced in Block S112. For example, the heating subsystem can include a resistive heating element coupled to the extruder 310, and the ink deposition system 300 can draw actuate the resistive heating element and manipulate the extruder 310 over the pattern piece according to the trace layout in order to rapidly evaporate the solvent from the conductive ink, thereby hardening the conductive ink into the trace layout.

In yet another implementation, the ink deposition system 300 can include a solvent reservoir and valve coupled to the extruder 310, and the extruder 310 can include a mixing nozzle that mixes solvent fed from the solvent reservoir with conductive ink from the conductive ink reservoir 314 before dispensing conductive ink onto a pattern piece. In this implementation, the ink deposition system 300 can vary an amount of additional solvent added to the conductive ink throughout a pattern piece processing cycle in order to achieve target hardening times for conductive ink thus deposited. For example, the ink deposition system 300 can add a greatest volume of additional solvent—corresponding to a known or anticipated duration of a pattern piece processing cycle—to the conductive ink at the beginning of the pattern piece processing cycle, and the ink deposition system 300 can reduce the volume of additional solvent added to the conductive ink as the pattern piece processing cycle progresses such that all conductive ink deposited on the pattern piece hardens at substantially the same time.

However, the ink deposition system 300 can include any other subsystem to modify the conductive ink or one or more ambient conditions over the processing platform 302 to control a hardening time (and/or a cure time) of conductive deposited onto a pattern piece or other fabric section.

3.5 Component Placement

Block S130 of the first method S100 recites, at a second time succeeding the first time by a duration less than a drying period of the volume of conductive ink, setting an electrical component in the volume of conductive ink and across the trace break. Generally, in Block S130, the ink deposition system 300 functions to place one or more batteries, sensors, actuators, passive circuit components, and/or active circuit components, etc. on a fabric section. For example, the ink deposition system 300 can include a component placement subsystem 320 implementing component placement techniques to select surface-mount circuit components from a set of component reels, to orient components for corresponding positions on a fabric section, and to place components on the fabric section in their corresponding positions.

In one implementation, the ink deposition system 300 deposit conductive ink onto a fabric section according to a trace layout in Block S120, places components onto the fabric section with leads directly immersed into and retained by the uncured conductive ink in Block S130, and then deposits a sealant over the conductive ink (and the installed electrical components) once the conductive ink is sufficiently dry. For example, once conductive ink is deposited onto a fabric section, the component placement subsystem 320 can place an electrical component directly onto the fabric section such that surface-mount pins or flat contact leads of the component contact and are retained by corresponding two or more corresponding traces of uncured conductive ink terminating at the placement location of the electrical component. In this implementation, the component placement subsystem 320 can place electrical components on the fabric section within a threshold period of time less than a cure time of the conductive ink at a deposited cross-sectional area, and the ink deposition system 300 can deposit sealant over conductive ink traces once the cure time has passed for all or local sections of the conductive ink trace layout.

In a similar implementation, the ink deposition system 300 further includes an adhesive dispenser configured to deposit adhesive onto a fabric section at or near the target location of electrical components to be subsequently installed on the fabric section in Block S130. For example, ink deposition system 300 can: dispense conductive ink onto the fabric section according to a trace layout; manipulate the adhesive dispenser to dispense beads of adhesive onto the fabric section at target locations for electrical components; and then actuate the component placement subsystem 320 to place electrical components into corresponding beads of adhesive and into contact with the corresponding conductive ink traces. The ink deposition system 300 can thus dispense adhesive onto a fabric section to bond electrical components to the fabric section. Alternatively, the ink deposition system 300 can first: manipulate the adhesive dispenser to dispense beads of adhesive onto the fabric section at target locations for electrical components; actuate the component placement subsystem 320 to place electrical components into corresponding beads of adhesive on the fabric section; and only then dispense conductive ink onto the fabric section to connect leads (e.g., flat leads) on the electrical components—held in place by the adhesive—according to the trace layout selected for the fabric section.

The ink deposition system 300 can thus dispense adhesive onto a fabric section to bond electrical components to the fabric section. In this implementation, the adhesive dispenser can dispense a UV-curable adhesive, and the ink deposition system 300 can cure dispensed adhesive by activating a UV light source over the processing platform 302 once the electrical components are in place on the fabric section. Alternatively, the ink deposition system 300 can heat the fabric section to cure dispensed adhesive or allow the adhesive to cure over time.

In the variation of the ink deposition system 300 that includes a tensioning subsystem 330, as described above, the ink deposition system 300 can place electrical components on the fabric section after the tensioning subsystem 330 returns the fabric section to an untensioned (or to a minimally tensioned) state. For example, the ink deposition system 300 can first tension a fabric section in Block S110; deposit conductive ink on the tensioned fabric section; return the fabric section to a substantially untensioned state; and then place electrical components on the fabric section prior to full hardening of the conductive ink.

However, the ink deposition system 300 can place electrical components on a fabric section in any other way and according to any other schema.

3.6 Trace Former

The ink deposition system 300 can also include a die roller, and the ink deposition system 300 can draw the die roller over a trace of conductive ink deposited onto a fabric section to form the height and/or width of the trace and/or to drive conductive ink into the fabric section. In one example, the ink deposition system 300 includes: a cylindrical die roller defining a groove of width and depth corresponding to a target trace width and to a target trace height, respectively, about the outer cylindrical surface of the die roller; and a spindle coupled to the extruder 310 head, supporting the die roller over the processing platform 302, and configured to orient the die roller (along a Z-axis of the processing platform 302). In this example, once the ink deposition system 300 deposits a line of conductive ink onto a fabric section, the ink deposition system 300 can drive the die roller downward to contact the fabric section and then draw the die roller over the line of conductive ink to form the line of conductive ink into a trace of a target width and a target height corresponding to the groove defined by the die roller. In this example, the fingers (and/or the spools) can retain the fabric section in place while the die roller is drawn laterally and longitudinally across the surface of the fabric section.

In this implementation, the ink deposition system 300 can also include a solvent supply system that releases (e.g., "drips") solvent (e.g., hexane) onto the die roller as the ink deposition system 300 draws the die roller across the surface of a fabric section in order to lubricate the die roller and to dissolve conductive ink collected by the die roller, thereby preventing conductive ink from collecting on the die roller and preventing the die roller from sticking to a trace and/or to the fabric section.

Furthermore, the ink deposition system 300 can include a set of die rollers, wherein each die roller defines a groove of a unique width and depth—within the set of die rollers—on its outer cylindrical surface. The ink deposition system 300 can thus select a particular die roller—from the set of die rollers—based on a specified width and height of a trace for a fabric section and then draw the selected die roller over a corresponding line of conductive ink previously deposited onto the fabric section.

In this variation, the ink deposition system 300 can also include one or more flat dies that define cavities corresponding to three-dimensional electrode, trace, and/or pad geometries for conductive ink. For example, the ink deposition system 300 can include: a first die defining a group of recesses corresponding to three-dimensional trace terminals for 3316 metric surface mount package sizes (e.g., for resistors, capacitors); and a second die defining a recess corresponding to a three-dimensional trace electrode for a battery terminal or power connector. In this implementation, prior to placing components on a fabric section in Block S130, the ink deposition system 300 can select a flat die—from a set of available flat dies—and stamp the selected flat die into uncured conductive ink on the fabric section to locally form the conductive ink into a particular three-dimensional structure suitable to accept a particular electrical component.

However, the ink deposition system 300 can post-process or form conductive ink deposited onto a fabric section in any other suitable way.

3.7 Punch

The ink deposition system 300 can include a punch, a die, and a punch actuator configured to punch holes in a fabric section, such as in a pattern along one or more lines designated to receive conductive ink on a fabric section. For example, prior to depositing conductive ink onto a fabric section, the ink deposition system 300 can drive the punch into select points on the fabric section (and onto the die supporting the fabric section below) to punch a sequence of holes, and the ink deposition system 300 can then deposit conductive ink in one or more lines coincident these holes on the surface of the fabric section. In this example, the conductive ink can flow into these holes (and to the back surface of the fabric section) in order to achieve greater adhesion between the traces of conductive ink and the fabric section once the conductive ink is cured.

3.8 Surface Activator

The ink deposition system 300 can include a surface activator subsystem configured to dispense a solvent onto a fabric section to locally activate regions of the fabric section in preparation to receive conductive ink. For example, the ink deposition system 300 can include: a reservoir configured to contain a volume of solvent (e.g., hexane); a nozzle fluidly coupled to the reservoir and supported on the extruder 310; and a pump configured to selectively pump solvent from the reservoir into the nozzle. In this implementation, prior to dispensing conductive ink onto a fabric section, the ink deposition system 300 can drive the nozzle downward onto (or substantially near) the surface of the fabric section, actuate the pump, and the move the nozzle laterally and/or longitudinally across the fabric section—following a trace path designated for the fabric section; solvent thus dispensed onto the fabric section can clean and activate select regions of the fabric section in preparation to bond with a line of conductive ink.

The ink deposition system 300 can additionally or alternatively include: a vacuum supply and nozzle configured to collect dust and debris from a fabric section; a plasma surface activator configured to activate local regions of a fabric section; or any other subsystem configured to prepare all or select areas of a fabric section to bond with a volume of conductive ink.

3.9 Sealant Deposition

Block S140 of the first method S100 recites depositing a volume of nonconductive sealant over the volume of conductive ink. Generally, in Block S140, the ink deposition system 300 functions to deposit a sealant over conductive ink traces and/or electrical components deposited onto a fabric section. In one implementation, the ink deposition system 300 includes a sealant reservoir 316 and a sealant extruder coupled to the conductive ink extruder described above. Once conductive ink is deposited into a fabric section, electrical components placed on the fabric section, and the conductive ink suitably hardened or cured, the ink deposition system 300 can actuate the actuator subsystem 312 to draw the sealant extruder across conductive ink traces on the fabric section. In this implementation, the sealant extruder can include a nozzle broader (i.e., wider) that a nozzle in the conductive ink extruder such that sealant deposited by the sealant extruder extends beyond the full width of a conductive ink trace and onto an adjacent area of fabric, thereby sealing both the top and side of the conductive ink trace.

The sealant extruder can deposit sealant similar to the conductive ink but substantially nonconductive. For example, the sealant extruder can deposit a sealant of a volatile solvent and polymer particles substantially identical to the solvent and polymer particles of the conductive ink (e.g., hexane and natural non-vulcanized rubber microparticles). In liquid form, the polymer particles of the sealant can be dissolved in solution (or in suspension) in the volatile solvent, and the solvent can evaporate following application onto a fabric, thus leaving polymer particles to harden and bond to the fabric. Like solvent in the conductive ink, when sealant is deposited into a fabric section, solvent in the sealant can similarly activate an adjacent region of the fabric section and superficially soften an adjacent trace of conductive ink, thus preparing the fabric and the conductive ink trace to bond with the polymer particles in the sealant.

The sealant can be colored with a dye, tint, or other colored particulate. For example, the sealant can be color-matched to a fabric section and deposited over conductive ink traces and electrical components previously deposited onto the fabric section, thereby concealing the conductive ink traces and the electrical components.

However, the ink deposition system 300 can deposit a sealant of any other type in any other way onto a conductive ink trace and/or onto a electrical component dispensed onto a fabric section.

3.10 Alternative Inks

In one variation, the ink deposition system 300 deposits a magnetic ink. In this variation, the magnetic ink can include a volume of solvent and polymer particles like the conductive ink; rather than conductive particulate, the magnetic ink can include magnetic particulate, such as neodymium, rare earth, ceramic, samarium cobalt, or alnico permanent magnet nanoparticles. In this variation, the ink deposition system 300 can also include a magnetic field driver that induces a directional magnetic field across the processing platform 302 as the magnetic ink hardens and cures such that the magnetic ink maintains a desired magnetic polarity once the magnetic ink has cured. The ink deposition system 300 can therefore dispense a magnetic ink onto a fabric section and induce a directional magnetic field across the fabric section to produce a flexible permanent magnet on a fabric backing.

In another variation, the ink deposition system 300 deposits n-type and p-type silicone inks. For example, the ink deposition system 300 can deposit an n-type silicone ink including a volume of solvent, polymer particles, and particles of silicone doped with phosphorus. In this example, the ink deposition system 300 can deposit a p-type silicone ink including a volume of solvent, polymer particles, and particles of silicone doped with boron. In this variation, the ink deposition system 300 can selectively deposited n-type silicone ink and p-type silicone ink onto a fabric section to construct a transistor (e.g., a BJT, a FET) directly onto the fabric section.

In yet another variation, the ink deposition system 300 deposits: battery electrode ink containing solvent, polymer particles, and particulate for an electrode of a metal-air battery, such as lithium or zinc particulate; and an electrolytic ink, such as carbonate (e.g., a carbonic acid salt) particulate in an aqueous suspension of polymer particles (e.g., natural rubber) and solvent. In this variation, a region of a fabric section can function as a porous cathode, and the ink deposition system 300 can: deposit a trace of conductive ink over the region of the fabric section to form a conductive lead from the cathode; deposit a layer (e.g., a 3"-wide, 3"-long, 0.06" layer) of electrolytic ink over the region of the fabric section to form an electrolyte layer; deposit a layer of battery electrode ink over the electrolyte layer to form an anode; and then deposit a trace of conductive ink over the layer of battery electrode ink to form a conductive lead from the cathode. The ink deposition system 300 can thus fabricate a flexible metal-air battery directly onto a fabric section and can connect this battery other electrical components or circuits on the fabric section via additional traces of conductive ink. The ink deposition system 300 can also seal the outer surface of a battery anode with sealant, as described above.

However, the ink deposition system 300 can deposit inks of any other type onto the fabric to construct any other suitable electrical circuit, electoral component, etc.

4. Garment, Garment Insert, and Second Method

Figure 8:
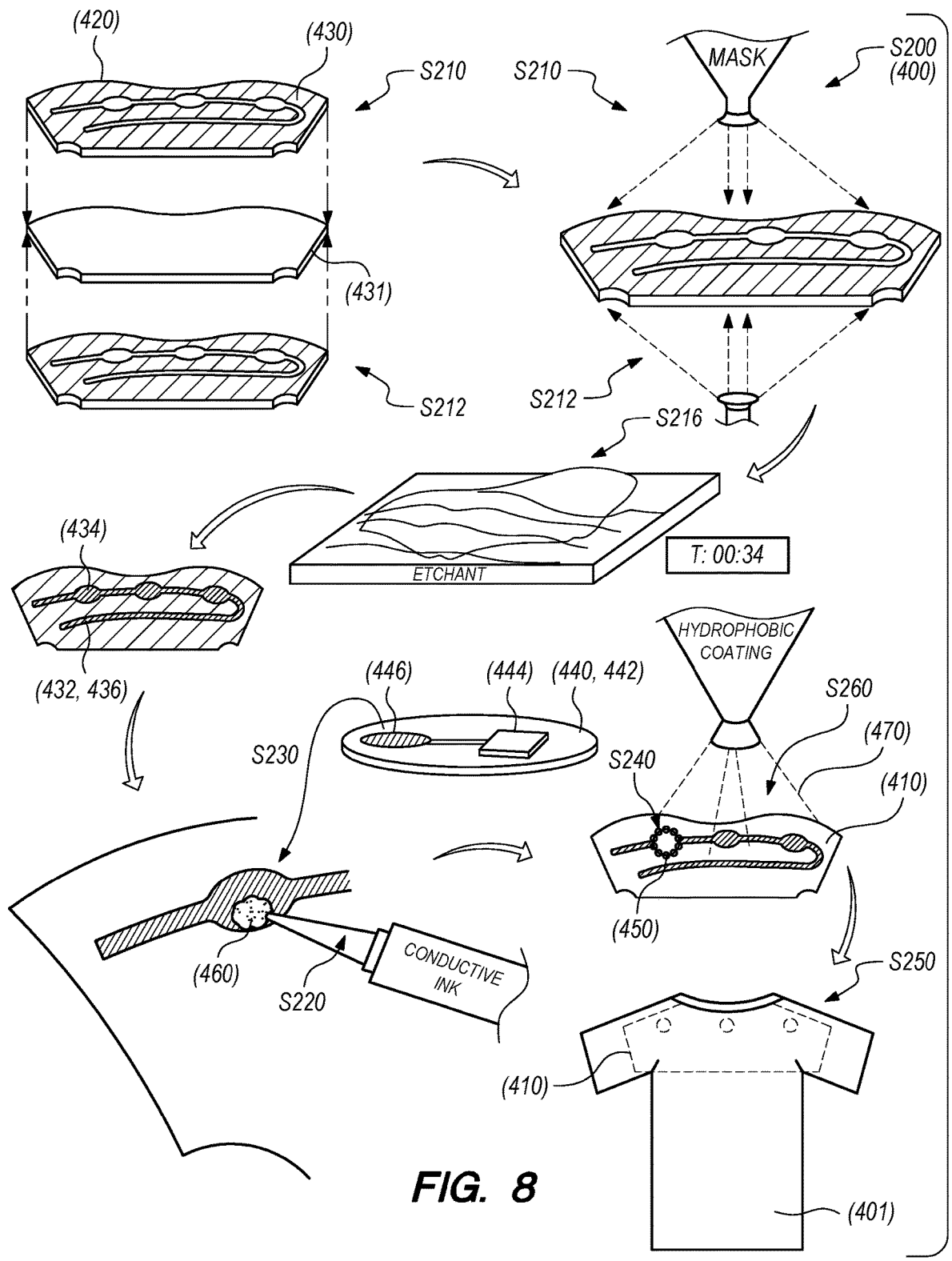
FIG. 8 is a flowchart representation of a second method.

As shown in FIG. 8, a second method S200 for fabricating a garment includes: applying a first mask to a first side of a fabric substrate 420 coated with a conductive material in Block S210; applying a second mask to a second side of the fabric substrate 420 opposite the first side, the second mask including a mirrored image of the first mask in Block S212; applying an etchant to the fabric substrate 420 to remove conductive material outside of the first mask in Block S214; arranging a conductive interface pad 446 of a component carrier 440 over an electrode 444 defined by remaining conductive material on the fabric substrate 420 in Block S230, the component carrier 440 including a flexible substrate 442 and a rigid electrical component 444 mounted to the flexible substrate 442, the conductive interface pad 446 extending from a terminal of the rigid electrical component 444 across a region of the flexible substrate 442; mechanically fastening the component carrier 440 to the fabric substrate 420 to form a garment insert 410 including an electrical circuit in Block S240; and incorporating the garment insert 410 into the garment 400 in Block S250.

Figure 9:
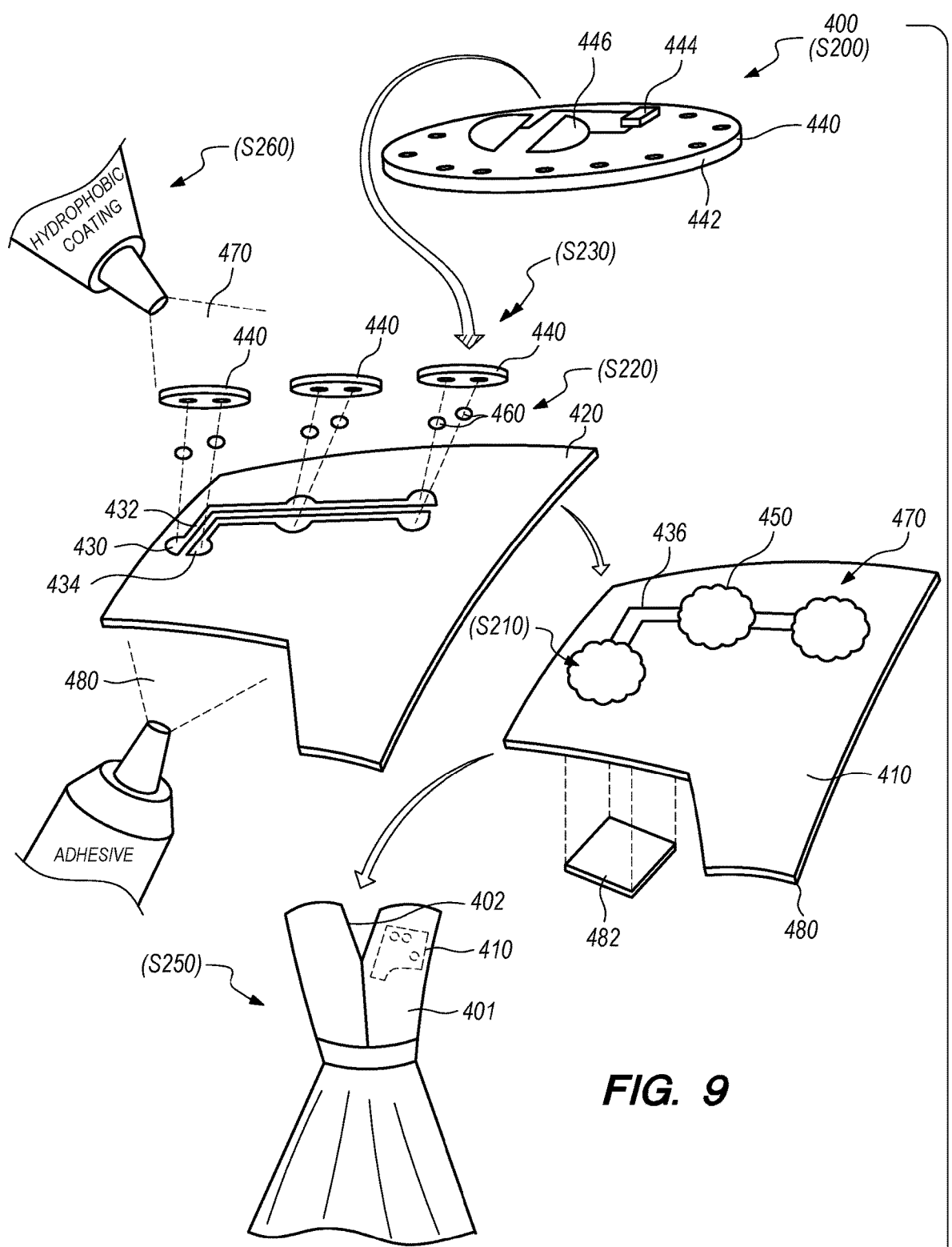
FIG. 9 is a flowchart representation of a garment.

As shown in FIG. 9, a garment 400 includes: an outer layer including a textile; a lining including a textile; and a garment insert 410 interposed between the outer layer and the lining. The garment insert 410 includes: a fabric substrate 420; a layer of conductive material 430 coated onto a first side of the fabric substrate 420 and selectively etched from the fabric substrate 420 to form traces 432 of an electrical circuit 436 across the fabric substrate 420; and a component carrier 440. The component carrier 440: includes a flexible substrate 442, a rigid electrical component 444 mounted to the flexible substrate 442, and a first conductive interface pad 446 extending from a first terminal of the rigid electrical component 444; and is mechanically coupled to the fabric substrate 420 with the first conductive interface pad 446 arranged over and electrically coupled to the layer of conductive material 430 to complete the electrical circuit.

As shown in FIG. 9, a garment insert 410 configured to be sewn into a garment includes: a fabric substrate 420; a layer of conductive material 430 coated onto a first side of the fabric substrate 420 and selectively etched from the fabric substrate 420 to form an electrode 444 within an electrical circuit on the fabric substrate 420; a volume of conductive ink 460 applied over the layer of conductive material 430 at the electrode 444; and a component carrier 440. The component carrier 440: includes a flexible substrate 442, an electrical component 444 mounted to the flexible substrate 442, and a conductive interface pad 446 arranged on the substrate and extending from a terminal of the electrical component 444; and is arranged over the fabric substrate 420 with the conductive interface pad 446 in contact with the volume of conductive ink 460 opposite the layer of conductive material 430. The garment insert 410 further includes: a filament 450 passing through the fabric substrate 420 and the component carrier 440 and configured to constrain the fabric substrate 420 and the component carrier 440 against the volume of conductive ink 460.

4.1 Applications

Generally, the second method S200 can be executed to produce a garment containing an electrical circuit fabricated across a flexible, fabric substrate 420. For example, the second method S200 can be executed to produce a shirt, a blouse, a vest, a dress, or a jacket containing: resistive heating elements (as described above) that output heat to improve a user's comfort; light-emitting diodes ("LEDs") that output light to improve the user's visibility to others as night; or a biometric sensor that detects a biosignal of the user; and a flexible, on-fabric wireless antenna and wireless transceiver for communicating data between the garment 400 and an external device (e.g., a smartphone, a tablet). Blocks of the second method S200 can be similarly implemented to produce a garment insert 410 (or a "patch") defining a standalone flexible textile-based circuit that can later be incorporated into a garment by a user or other supplier, such as with a clothes iron, with fabric adhesive, or by stitching.

The second method S200 can therefore be executed to produce a unit of the garment insert 410 containing: a fabric (i.e., "textile") substrate, such as cotton or taffeta; a conductive material selectively applied to (e.g., via screen printing) or plated onto and selectively etched from the fabric substrate 420 to form traces 432 of an electrical circuit 436; and a component carrier 440 containing a flexible electronic circuit board and a rigid electrical component 444 mounted to the fabric substrate 420 in contact with the conductive material to complete the electrical circuit. The garment insert 410 can also include multiple component carriers—such as component carriers containing one of a battery, a biometric sensor, a LED, a switch, and a controller—that cooperate with traces fabricated across the fabric substrate 420 to complete an electrical circuit. By connecting electrical components—mounted to component carriers—via conductive traces fabricated on a fabric substrate 420, the garment insert 410 can remain soft and flexible, can be incorporated into a garment with traditional garment production techniques, and can be substantially free of wires or a wiring harness that may add bulk, complexity, and fragility to a fabric-based electrical circuit. In particular, the garment insert 410 can include both: fabric-based components (i.e., the fabric substrate 420 and the conductive layer) produced by a textile manufacturer according to traditional textile production techniques, such as screen printing and acid washing; and electronics components (i.e., the component carrier 440 and the electrical component 444) produced by an electronics manufacturer according to traditional electronics production techniques, such as PCB etching, component placement, and reflowing. The fabric-based components and electronics components can then be assembled into the garment insert 410 and/or integrated into a complete garment by the textile manufacturer or by a garment manufacturer according to traditional garment production techniques, such as stitching, hemming, and pressing to create a flexible, soft smart-textile substantially free of wires.

Blocks of the second method S200 can therefore be executed by one or more of an electronics manufacturer, a textile manufacturer, and a garment manufacturer to produce a garment insert 410 or a complete garment configured to output light, to output heat, to output an audio signal, to collect biosignal data (e.g., heart rate, skin temperature, skin conductivity, or arterial oxygen saturation, etc.), and/or to transmit user biosignal data to an external device, etc.

4.2 Fabric Substrate and Conductive Coating

Block S210 of the second method S200 recites applying a first mask to a first side of a fabric substrate 420 coated with a conductive material; Block S212 of the second method S200 recites applying a second mask to a second side of the fabric substrate 420 opposite the first side, the second mask including a mirrored image of the first mask; and Block S214 of the method recites applying an etchant to the fabric substrate 420 to remove conductive material outside of the first mask. Generally, in Blocks S210, S212, and S214, a mask is applied to both sides of a fabric substrate 420 containing a conductive coating 430, and the conductive coating 430 is then etched to selectively remove regions of the conductive coating 430 from the fabric substrate 420, as shown in FIG. 8. In particular, in Blocks S210, S212, and S214, a first mask is applied across a first side of the fabric substrate 420 and the conductive coating 430, a mirror of the first mask is applied the opposite side of the fabric substrate 420 in alignment with the first mask, and an etchant is applied to both sides of the fabric substrate 420 to etch (i.e., remove) the conductive material from both sides of the fabric substrate 420. Because the fabric substrate 420 may be porous to liquid and thus enable etchant to move laterally through the fabric substrate 420 and past the first mask as a function of etching time, both sides of the fabric substrate 420 can be masked and then exposed to the etchant for a limited period of time to achieve complete removal of the conductive material outside of the first mask on the first side of the fabric substrate 420 while maintaining relatively high transfer accuracy of edges of the first mask to the final geometry of remaining conductive material on the fabric substrate 420.

The garment insert 410 includes: a fabric substrate 420; and a layer of conductive material 430 (hereinafter the "conductive coating 430") coated onto a first side of the fabric substrate 420 and selectively etched from the fabric substrate 420 to form traces 432 of an electrical circuit 436 (e.g., including an electrode 444) across the fabric substrate 420. In one implementation, the fabric substrate 420 includes a section of woven textile, such as cotton-, flax-, jute-, hemp-, modal-, bamboo-, silk, velvet-, or taffeta-based fabric. In this implementation, the layer of conductive coating 430 includes a metal (e.g., copper) or a metal alloy (e.g., copper alloyed with silver, zinc, aluminum, nickel, and/or silicon) plated across one or both sides of the section of woven textile. For example, the fabric substrate 420 and the layer of conductive coating 430 can include a section of taffeta electrolessly plated with copper to form copper taffeta. However, the fabric substrate 420 and layer of conductive coating 430 can be of any other form or materials.

In Blocks S210 and S212, a mask is applied to the first and second sides of the fabric substrate 420—that is, across the layer of conductive coating 430—in preparation to selectively remove regions of the layer of conductive coating 430 via etching, as shown in FIG. 8. In one example, a mask pattern is formed by removing sections corresponding to desired regions of remaining conductive material on the fabric substrate 420 from a vinyl sheet, such as with a computer-numeric-controlled (CNC) vinyl cutter. In this example, the material can be removed from the vinyl sheet to form a negative representation of one or more traces, electrodes, and/or contact pads, etc. The mask pattern is then centered over the first side of the fabric section face up, and an etch resist material is rolled or sprayed over the mask pattern in Block S210, thereby coating the desired regions of remaining conductive material on the first side of the fabric substrate 420 with the etch resist. The mask pattern is subsequently inverted and centered over the second side of the fabric section, and the etch resist material is rolled over the inverted mask pattern in Block S212, thereby coating the second side of the fabric section with etch resist directly adjacent desired regions of remaining conductive material on the first side of the fabric substrate 420.

In another example, a first mask and a second mask can be formed by trimming a sheet of peel-and-stick or iron-on vinyl to remove sections corresponding to desired regions of remaining conductive material on the first side of the fabric substrate 420, such as with a CNC vinyl cutter, as described above. In this example, the first mask can then be adhered or ironed onto the first side of the fabric substrate 420 in Block S210, and the second mask can be similarly adhered or ironed onto the second side of the fabric substrate 420 in alignment with the first mask above (i.e., features of the second mask in alignment with features of the first mask projected through the fabric substrate 420) in Block S212.

In yet another example, the first and second masks are screen-printed onto the first and second sides of the fabric section, respectively. Similarly, the first and second masks can be printed onto the first and second sides of the fabric section directly with an inkjet printer. In yet another example, the first and second masks can be applied to the fabric substrate 420 via lithography. However, the first and second masks can be applied to the first and second sides of the fabric substrate 420 in any other suitable way in Blocks S210 and S212.

Once the etch resist is applied to both sides of the fabric substrate 420, the fabric substrate 420 is exposed to etchant in Block S214 to remove sections of the conductive coating 430 not covered by the etch resist, as shown in FIG. 8. For example, liquid etchant (e.g., ferric chloride) can be sprayed onto the first and second sides of the fabric substrate 420. Alternatively, the fabric substrate 420—with conductive coating 430, first mask, and second mask—can be placed in a bath containing liquid etchant. The fabric substrate 420 can be exposed to etchant for a particular period of time based on a thickness of the conductive coating 430 and a permeability of the fabric substrate 420 to the etchant before the etchant is removed and/or neutralized. In particular, in the implementation in which the fabric substrate 420 is coated on its first side only with conductive material and is submerged in an etchant bath following application of the first and second masks, etchant may permeate the second side of the fabric substrate 420 and etch the conductive coating 430 from its back side, thereby increasing (e.g., approximately doubling) an etch rate of the conductive coating 430 as a function of the permeability of the fabric substrate 420 to the etchant. However, the etchant may also move laterally through the fabric substrate 420 as a function of the permeability of the fabric substrate 420 to the etchant, thereby etching the conductive coating 430 under the first mask. However, because target regions of the conductive coating 430 are etched from both sides of the fabric substrate 420, the rate of vertical etching may be substantially greater than (e.g., twice) the total rate of lateral etching, thereby enabling complete removal of target regions of the conductive coating 430 with substantially minimal etching beyond the boundary of first mask.

In the foregoing implementation, once the etch time is complete, the fabric substrate 420 can be washed with a neutralizer (e.g., a basic solution, such as including sodium bicarbonate) to cease etching and further removal of the conductive coating 430. The first and second masks can then be removed from the fabric substrate 420, such as by peeling the masks from the fabric substrate 420 or by exposing the fabric substrate 420 to a second chemical solution configured to dissolve the first and second mask material. Alternatively, only select sections of the first and/or second masks can be removed from the fabric substrate 420 to expose conductive interface pads, electrodes, and/or other features of the conductive coating 430 for subsequent connection to a component carrier 440 or other electronic device, such as by mechanically abrading the first and/or second mask to expose these features in the conductive coating 430.

In a similar implementation, the second mask can define a modified mirror image of the first mask but with widened mask areas. In one example in which the first mask defines a large unmasked area adjacent one or more narrow masked lines, the second mask can define a similar large unmasked area adjacent similar but wider masked lines in order to achieve a more rapid etch rate across a first region of the conceive coating coincident the large unmasked area than around a second region of the conceive coating coincident the narrow masked lines in Block S214, thereby yielding greater etching control across small features resulting in traces etched into the conductive layer. In particular, the second mask can define larger masked features corresponding to features of the first mask in order to achieve local reduction in etch rate around smaller, more sensitive, and/or more precise masked features by reducing local exposure to etchant from the second side of the fabric substrate 420.

Conversely, the second mask can define smaller masked features corresponding to features of the first mask in order to increase the conductive coating's local exposure to etchant from the second side of the fabric substrate 420, thereby increasing the local etch rate around smaller, more sensitive, and/or more precise masked features to achieve finer traces and/or other features in the final etched layer of conductive material 430.

In an alternative implementation, the fabric substrate 420 is coated with the layer of conductive material 430 on its first side only, the first mask is applied over the first side of the fabric substrate 420 to isolate select regions of the conductive coating 430 from the etchant, and the second side of the fabric substrate 420 is masked fully across its length and width to prevent or limit exposure of the back side of the conductive coating 430 to the etchant in Block S214. The fabric coating and the conductive coating 430 can then be processed as described above to selectively remove areas of the conductive coating 430 from the first side of the fabric substrate 420. In this implementation, a section of the second mask corresponding to a large unmasked region of the first mask can be removed or perforated (e.g., with small bores or holes in a grid array) in order to expose the conductive coating 430 to additional etchant through the second side of the fabric substrate 420 and to selectively increase the etch rate of a large, corresponding region of the conductive coating 430.

In another implementation, the fabric substrate 420 is coated with a first layer of conductive material 430 on its first side and a second layer of conductive material 430 on its second side. In this implementation, the first conductive coating 430 can alone be masked in Block S210, and the first conductive coating 430 can be selectively etched and the second conductive coating 431 fully etched in Block S214 to form a single set of traces of the first side of the fabric substrate 420. Alternatively, a first mask defining a first trace layout can be applied to the first side of the fabric substrate 420 in Block S210, a second mask defining a second trace layout—unique to the first trace layout—can be applied to the second side of the fabric substrate 420 in Block S212, and the fabric substrate 420 can be exposed to etchant in Block S214 to form a first conductive trace on the first side of the fabric substrate 420 and a second conductive trace on the second side of the fabric substrate 420. In this implementation, the fabric substrate 420 can thus function as a flexible, insulative substrate offsetting the first and second conductive layers.

In the foregoing implementation, a first electrode 444 defined by the first layer of conductive material 430 can be electrically coupled to a second electrode opposite the first electrode 444 and defined by the second layer of conductive material 430 with a conductive thread stitched through the fabric substrate 420 and intersecting the first and second electrodes to form a "via." Alternatively, the first and second electrodes can be electrically coupled with a metallic (e.g., chrome-plated brass) rivet 490 or button installed in the fabric substrate 420 and intersecting the first and second electrodes. However, a region of the first conductive layer on the first side of the fabric substrate 420 can be electrically coupled to a region of the second conductive layer on the second side of the fabric substrate 420 in any other way. Furthermore, the fabric substrate 420 and the conductive coating 430 can include any other materials fabricated in any other way to form traces 432 of an electrical circuit 436 over a section of flexible woven textile.

4.3 Component Carrier

The component carrier 440 of the garment insert 410 includes: a flexible substrate 442; a rigid electrical component 444 mounted to the flexible substrate 442, and a first conductive interface pad 446 extending from a first terminal of the rigid electrical component 444. The component carrier 440 is also mechanically coupled to the fabric substrate 420 with the first conductive interface pad 446 arranged over and electrically coupled to the layer of conductive material 430 to complete the electrical circuit. Generally, the component carrier 440 contains a rigid electrical component 444 mounted to a flexible substrate 442 (e.g., a flexible PCB) that, once installed on the fabric substrate 420, functions as an interface between the rigid electrical component 444 and the soft, flexible, and/or elastic material of the fabric substrate 420.

In one implementation, the component carrier 440 defines a "button" that is mechanically fastened and/or chemically adhered to the fabric substrate 420, as described below, and spans a small area of the fabric substrate 420. In this implementation, the component carrier 440 includes: a flexible substrate 442, such as a polyimide substrate, a polyether ether ketone (PEEK) substrate, or a transparent polyester or plastic film; and an etched metallic (e.g., copper) layer defining a solder pad, a conductive interface pad 446, and a trace extending between the solder pad and the conductive interface pad 446. For example, a component carrier 440 can include a twenty-millimeter-diameter round or five-millimeter by twenty-millimeter rectangular flexible PCB section and etched copper foil trace. In this implementation, a rigid electrical component 444 (e.g., a surface-mounted resistor, LED, or accelerometer) can be mounted to the flexible substrate 442 by soldering a terminal of the rigid electrical component 444 to the solder pad, such as via surface-mount methods and techniques including application of solder paste onto the solder pad, placement of the terminal of the rigid electrical component 444 into the solder paste, and reflow. The component carrier 440 can then be installed onto the fabric substrate 420 with the conductive interface pad 446 electrically coupled to an electrode 444 defined by a remaining region of the conductive coating 430 on the fabric substrate 420, as described below.

The component carrier 440 can include a single rigid electrical component 444 and one conductive interface pad 446 per terminal of the rigid electrical component 444. Alternatively, the component carrier 440 can include multiple rigid electrical components and multiple corresponding conductive interface pads.

In one example, the garment insert 410 defines a lighted safety vest insert. In this example, the garment insert 410 can include multiple lighted component carriers, wherein each lighted component carrier 440 includes a surface-mount LED and a resistor arranged in series between a first conductive interface pad 446 and a second conductive interface pad 446. In this example, the garment insert 410 can also include: a control component carrier 440 including a rigid analog switch; and a power component carrier 440 including a rechargeable battery. The conductive interface pads of the lighted component carriers, control component carrier 440, and power carrier can be installed over corresponding electrodes defined by the conductive coating 430 on the fabric substrate 420 to complete an electrical circuit such that, when the analog switch on the control component carrier 440 is actuated, the battery on the power component carrier 440 supplies power to LEDs on the lighted component carriers via traces defined by the conductive layer on the fabric substrate 420. In this example, the garment insert 410 can be installed in a safety vest—including an outer layer and an inner lining—defining a first shoulder section and a second shoulder section. The garment insert 410 can thus define a patch applied over the first shoulder region and/or the second shoulder region of the vest, such as with an adhesive. Alternatively, the outer layer of the safety vest can include a mesh or perforated material, and the garment insert 410 can be sewn into the lining of the safety vest behind the mesh material. The outer layer can thus function as a smooth protective layer over the garment insert 410 but can also pass light output by the LEDs, and the lining can function to support the garment insert 410.

In another example, the garment insert 410 is incorporated into a fitness or exercise garment in Block S250, as described below. In this example, the garment insert 410 can include: a sensing component carrier 440 including a rigid biometric sensor (e.g., a heart rate sensor, a skin temperature, a skin conductivity sensor, or an arterial oxygen saturation sensor); a control component carrier 440 including a rigid integrated circuit functioning as a controller; a power component carrier 440 including a rechargeable battery; and a wireless component carrier 440 including an rigid wireless transmitter integrated circuit and a rigid surface-mount clock. Once the component carriers are installed on the fabric substrate 420 over corresponding electrodes of the conductive coating 430: the battery component carrier 440 can power the controller and the wireless transmitter via corresponding traces on the fabric substrate 420; the controller can sample the rigid biometric sensor via a connecting trace on the fabric substrate 420; and the wireless transmitter can broadcast packets of biometric data read from the biometric sensor through a wireless antenna defined by the conductive coating 430 and fabricated directly on the fabric substrate 420.

In yet another example, the garment insert 410 is incorporated into a heated jacket in Block S250. In this example, the garment insert 410 can include: a control component carrier 440 including a rigid analog switch; and a power component carrier 440 including a rechargeable battery. A set of heating elements can be fabricated directly onto the fabric substrate 420, as described above, between traces defined by the conductive coating 430, and the control and power carriers can be installed in corresponding locations on the fabric substrate 420 in Blocks S220 and S240, as described below, to complete the circuit. The battery component carrier 440 can thus supply power to the heating elements via traces fabricated directly on the fabric substrate 420 when the rigid analog switch on the control component carrier 440 is actuated.

However, the garment insert 410 can include one or more component carriers of any other type or form and can include any other one or more electrical components or integrated circuits.

4.4 Conductive Ink

One variation of the second method S200 includes Block S220, which recites applying a volume of conductive ink 460 to the first side of the fabric substrate 420 over the electrode 444, the volume of conductive ink 460 configured to conduct electrical current between the electrode 444 and the conductive interface pad 446. Generally, in Block S220, a volume of conductive ink 460, such as described above, can be applied to the fabric substrate 420 over an electrode 444 defined by the conductive coating 430 before the component carrier 440 is installed on the fabric substrate 420 and can function as a conductive buffer that preserves contact between the electrode 444 on the fabric substrate 420 and the conductive interface pad 446 on the component carrier 440 as the garment insert 410 is folded, stretched, rolled, twisted, or otherwise manipulated.

One variation of the garment insert 410 can therefore include a volume of conductive ink 460 applied over the layer of conductive material 430 at the electrode 444, and the component carrier 440 can be arranged over the fabric substrate 420 with the conductive interface pad 446 in contact with the volume of conductive ink 460 opposite the layer of conductive material 430. In particular, the volume of conductive ink 460 can be interposed between an electrode 444 defined by the conductive coating 430 and a corresponding conductive interface pad 446 on the component carrier 440 and can conduct electrical current between the electrode 444 and the conductive interface pad 446. For example, the conductive ink can include a volume of solvent, elastic polymer particles in solution in the volume of solvent, and conductive metal particles, as described above. In this example, once the volume of solvent has fully volatized (i.e., evaporated), the volume of conductive ink 460 can include conductive metal particles suspended in an elastic polymer (e.g., latex) matrix.

In one implementation, an ink deposition system 300, as described above, deposits quantities of conductive ink onto the fabric substrate 420 over an electrode 444 defined by the conductive coating 430 in Block S220 before aligning the conductive interface pad 446 of the component carrier 440 with the electrode 444 on the fabric substrate 420 in Block S240. In this implementation, the ink deposition system 300 can tension a weft of the fabric substrate 420 while the conductive ink dries (i.e., while the solvent volatizes). For example, the ink deposition system 300 can: tension a region of the fabric substrate 420 containing the electrode 444 by 5% against the weft of the fabric substrate 420 (i.e., to a measured strain of 5% against the weft of the fabric substrate 420) in order to open woven regions of the fabric substrate 420 to accept conductive ink; deposit a preset volume of conductive ink 460 over the electrode 444; and release tension on the fabric substrate 420 after a calculated drying time. In this example, the ink deposition system 300 can calculate the drying time corresponding to a target estimated proportion of volatized solvent (e.g., 30%, 90%) based on current processing conditions, such as based on a current barometric pressure and a current ambient temperature. The ink deposition system 300 can set a timer for the calculated drying time once ink is deposited onto the fabric substrate 420 and then rapidly release tension on the fabric substrate 420 or slowly release tension on the fabric substrate 420 (e.g., at a rate of 0.5% strain per second) once the timer expires. The conductive ink can thus penetrate the fabric substrate 420 around a region of the conductive coating 430 defining the electrode 444, and the ink deposition system 300 can release tension on the fabric substrate 420 before the conductive ink fully dries such that the fabric substrate 420 compresses around the drying conductive ink and such that the conductive ink forms around both sides of the fabric substrate 420, thereby mechanically locking the conductive ink onto the fabric substrate 420.

Alternatively, the conductive ink can be applied to the fabric substrate 420 over the electrode 444 by screen-printing. For example, the fabric substrate 420 can be arranged across a porous or perforated tray, the tray can be submerged in a shallow solvent (e.g., acetone) bath, conductive ink can be screen printed onto select regions of the fabric substrate 420, and the tray can be elevated out of the solvent path for drying.

Yet alternatively, the conductive ink can be applied to the component carrier 440 over the conductive interface pad 446 in Block S230 prior to placement of the component carrier 440 onto the fabric substrate 420 in Block S240 and mechanical fastening of the component carrier 440 to the fabric substrate 420 in Block S250. However, any other quantity of conductive ink can be applied to the fabric substrate 420 and/or to the component carrier 440 in any other way in Block S230 to create a conductive interface between the conductive coating 430 on the fabric substrate 420 and the conductive interface pad 446 on the component carrier 440.

Alternatively, conductive ink can be printed on the fabric substrate, as described above, to additively form traces and electrodes on one or both sides of the fabric substrate. One or more component carriers can then be installed over and in electrical contact with traces of electrodes of conductive ink to complete an electrical on the garment insert 410, as described below.

4.5 Garment Insert+Component Carrier Connection

Block S230 of the second method S200 recites arranging a conductive interface pad 446 of a component carrier 440 over an electrode 444 defined by remaining conductive material on the fabric substrate 420, wherein the component carrier 440 includes a flexible substrate 442 and a rigid electrical component 444 mounted to the flexible substrate 442, and wherein the conductive interface pad 446 extends from a terminal of the rigid electrical component 444 across a region of the flexible substrate 442; and Block S240 of the second method S200 recites mechanically fastening the component carrier 440 to the fabric substrate 420 to form a garment insert 410 including an electrical circuit. Generally, in Blocks S230 and S240, the component carrier 440 is arranged over and mechanically fastened to the fabric substrate 420 with the conductive interface pad 446 of the component carrier 440 electrically coupled to the electrode 444 defined by the conductive coating 430.

In the variation described above in which conductive ink is applied to the fabric substrate 420 in Block S230, the component carrier 440 can be placed in contact with wet (i.e., uncured, not fully volatized) conductive ink such that the conductive ink bonds to the component carrier 440 before drying. (Similarly, in the variation described above in which conductive ink is applied to the component carrier 440 in Block S230, the component carrier 440 can be placed face down onto a corresponding region of the fabric substrate 420 while the conductive ink is still wet such that the conductive ink bonds to the fabric substrate 420 before drying.) For example, while the conductive ink is still wet, the component carrier 440 can be placed over the conductive ink such as manually by an operator or by a computer-numeric-controlled surface mount technology component placement system. As the conductive ink dries, the conductive ink can bond to the component carrier 440 to adhere the component carrier 440 to the fabric substrate 420. The conductive ink can thus preserve the location of the component carrier 440 on the fabric substrate 420 while the component carrier 440 is mechanically fastened to the fabric substrate 420 in Block S240.

Figure 10A:
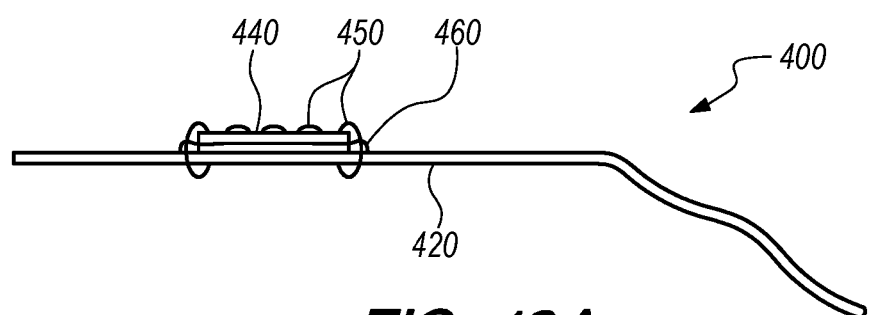
FIGS. 10A and 10B are flowchart representation of a garment insert.

In one implementation, Block S240 includes sewing a filament 450 (e.g., thread) through the fabric substrate 420 and the component carrier 440. In one example, the component carrier 440 is pierced by a needle and a thread simultaneously stitched through the component carrier 440 and the fabric substrate 420, such as with a running or overcast stitch, to fasten the component carrier 440 to the fabric substrate 420 in Block S240, as shown in FIG. 10A. For example, the component carrier 440 can be stitched onto the fabric substrate 420 with an electrically-insulative (e.g., non-conductive) thread, such as of cotton or wool. Alternatively, the component carrier 440 can be stitched onto the fabric substrate 420 with an electrically-conductive wire, such as copper or silver wire.

The component carrier 440 can alternatively be pierced or perforated separately and before installation on the fabric substrate 420 to accept a stitch. For example, the component carrier 440 can be fabricated with an array of vias, such as patterned along a perimeter of the flexible substrate 442 or around the perimeter of the conductive interface pad 446, and electrically-insulative thread can be passed through these vias and through the fabric substrate 420 to fasten the component carrier 440 to the fabric substrate 420 in Block S230, as shown in FIG. 9.

The component carrier 440 can be fastened to the fabric substrate 420 with a stitch running along the perimeter of the component carrier 440. In one example in which the component carrier 440 defines a circular section, the component carrier 440 can be stitched fully about its perimeter to the fabric substrate 420 in Block S240. In another example in which the component carrier 440 defines a rectangular section, the component carrier 440 can be stitched along its two long, opposing sides to the fabric substrate 420 in Block S240. Alternatively, in Block S240, a stitch can be passed through the conductive interface pad 446 and the corresponding electrode 444 on the fabric substrate 420 to mechanically constrain the conductive interface pad 446 onto the electrode 444

In the variation described above in which conductive ink is applied between the conductive interface pad 446 and an electrode 444 on the fabric substrate 420, thread can be stitched through the component carrier 440 and the fabric substrate 420 about a perimeter of the conductive interface pad 446 in Block S240 to compress conductive ink between the perimeter of the conductive interface pad 446 and the electrode 444. Similarly, a stitch can pierce the component carrier 440 at the conductive interface pad 446 and pass through the conductive ink and through the electrode 444 on the fabric substrate 420 to mechanically bind the conductive ink between the conductive interface pad 446 and the electrode 444.

Figure 10B:
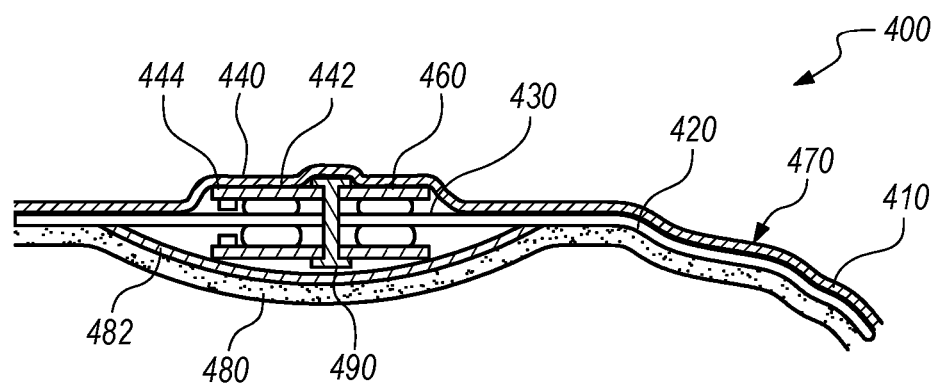

In another implementation, the component carrier 440 can be mechanically fastened to the fabric substrate 420 with a clothing button stitched to the fabric substrate 420 and passed through the component carrier 440 (or vice versa). For example, the flexible substrate 442 of the component carrier 440 can define a slit intersecting the conductive interface pad 446 and configured to receive a button stitched to the fabric substrate 420 over the electrode 444. In yet another implementation, the component carrier 440 can be riveted to the fabric substrate 420, such as through the conductive interface pad 446, the electrode 444, and through a second component carrier on the opposite side of the fabric substrate, as shown in FIG. 10B. However, the component carrier 440 can be aligned with and mechanically fastened to the fabric substrate 420 in any other way in Blocks S230 and S240.

4.6 Hydrophobic Coating

As shown in FIGS. 9 and 10B, one variation of the second method S200 includes Block S260, which recites applying a non-conductive hydrophobic coating 470 across the first side of the fabric substrate 420, the second side of the fabric substrate 420, and a side of the component carrier 440 opposite the fabric substrate 420. Generally, in Block S260, a flexible hydrophobic coating 470 can be applied across both sides of the fabric substrate 420 to encase the conductive coating 430. The hydrophobic coating 470 can also be applied across the component carrier 440, such as across a back side of the component carrier 440 opposite the fabric substrate 420 and across a junction between the first side of the fabric substrate 420 and the back side of the component carrier 440 to (substantially) fully seal the electronic circuit against moisture ingress.

The garment insert 410 can therefore include a hydrophobic coating 470 applied across the first side of the fabric substrate 420, across a second side of the fabric substrate 420 opposite the first side, and across the layer of conductive material 430. In one implementation, once the conductive coating 430 is selectively etched from the fabric substrate 420 in Block S214, a third mask is applied to the first side of the fabric substrate 420 to cover electrodes defined by the conductive coating 430, such as according to methods and techniques described above. A hydrophobic material—such as manganese oxide polystyrene, zinc oxide polystyrene, or precipitated calcium carbonate—can then be sprayed or rolled onto the first and second sides of the fabric substrate 420; the fabric substrate 420 can be dipped in a bath of hydrophobic material, removed from the bath, and dried; or the hydrophobic material can be applied to the first and second sides of the fabric substrate 420 in any other way. Once the hydrophobic material is applied to and cured on the fabric substrate 420, the third mask can be removed from the first side of the fabric substrate 420, such as described above.

In the variation described above in which a first conductive coating 430 defining traces of a first circuit is applied to the first side of the fabric substrate 420 and in which a second conductive coating 431 defining traces of a second circuit is applied to the second side of the fabric substrate 420, electrodes defined by the first and second conductive coatings can be similarly masked prior to application of the hydrophobic coating 470 onto the first and second sides of the fabric substrate 420, and the mask(s) can be removed from the fabric substrate 420 to expose these electrodes prior to installation of one or more component carriers onto the fabric substrate 420. The first and second sides of the fabric substrate 420 can thus be coated with hydrophobic material—except over electrodes subsequently connected to conductive interface pads of corresponding component carriers—in Block S260.

In the foregoing implementation, when the conductive interface pad 446 of the component carrier 440 is placed over a corresponding electrode 444 on the fabric substrate 420, the perimeter of the component carrier 440 can extend over a region of the fabric substrate 420 coated with the hydrophobic material. Prior to arrangement on the fabric substrate 420 in Block S230, a flexible sealant, such as silicone or urethane, can be applied around the perimeter of the component carrier 440 and can bond to both the flexible substrate 442 of the component carrier 440 and to the hydrophobic coating 470 on the fabric substrate 420 to seal the electronic component—mounted to the component carrier 440—between the flexible substrate 442 and the fabric substrate 420. (Alternatively, the flexible sealant can be applied to fabric substrate 420 over the hydrophobic coating 470 and can bond to the flexible substrate 442 of the component carrier 440 when the component carrier 440 is installed thereover in Block S230.) Alternatively, the flexible sealant can be applied to the garment insert 410 around the perimeter of the component carrier 440 once the component carrier 440 is installed on the fabric substrate 420 in Block S240.

In another implementation, the garment insert 410 is coated with hydrophobic coating 470 following assembly of the fabric substrate 420 and the component carrier 440. In this implementation, the garment insert 410—including the fabric substrate 420, conductive coating 430, and component carrier 440—can be sprayed with or submersed in hydrophobic material in order to coat exposed regions of the fabric substrate 420, exposed regions of the conductive coating 430, and the back side of the component carrier 440 with hydrophobic material. In this implementation, prior to coating with hydrophobic material, a flexible sealant can be applied between the component carrier 440 and the fabric substrate 420, over the fabric substrate 420 around an electrode 444, or around a perimeter of the component carrier 440 adjacent the conductive interface pad 446, as described above, in order to bridge the component carrier 440 and the fabric substrate 420. The hydrophobic coating 470 can thus be applied across exposed regions of the fabric substrate 420, exposed regions of the conductive coating 430, the back side of the component carrier 440, and exposed surfaces of the flexible coating in Block S260 in order to fully seal the electronic circuit defined by the conductive coating 430 and the component carrier 440 from moisture ingress.

In this variation, elements of the garment insert 410 can be similarly coated with an oleophobic material or other material or sealant to improve durability of the electronic circuit in the presence of water, oil, dirt, and other contaminants. However, such coatings can be applied to the garment insert 410 in any other way in Block S260.

4.7 Garment

Block S250 of the second method S200 recites incorporating the garment insert 410 into the garment. Generally, in Block S250, the garment insert 410 can be stitched into or applied onto a garment in order to incorporate electronic or digital functions into the garment.

In one implementation, the garment includes an outer layer of a textile material and a lining, also of a textile material. In this implementation, the garment layer can be installed between the outer layer and the lining, such as by sewing the garment insert 410 between the outer layer and the lining of the garment with an electrically-insulative (e.g., cotton-based) thread. The outer layer can thus function to conceal the garment insert 410, and the lining can function to buffer the garment insert 410 from a user's (i.e., a wearer's) skin.

Similarly, the garment can include a single aesthetic textile layer, and the garment insert 410 can be sewn over or under the aesthetic textile layer. For example, the garment insert 410 can be installed onto the aesthetic textile layer with the first side of the garment insert 410 facing the aesthetic textile layer, and an aesthetic coating (e.g., a fabric paint) can be applied across the second side of the fabric substrate 420 of the garment insert 410—facing outwardly from the aesthetic textile layer—to aesthetically align the garment insert 410 with the aesthetic textile layer. Alternatively, the garment insert 410 can be installed (e.g., sewn) under the aesthetic textile layer with the first side of the garment insert 410 facing the aesthetic textile layer, and the second side of the fabric substrate 420—which may be free of component carriers—can face and contact the user's skin. In this example: the garment insert 410 can include a biometric component carrier 440 arranged on the first side of the fabric substrate 420 and including a biometric sensor electrically coupled to a first electrode 444 defined by a first layer of conductive material 430 on the first side of the fabric substrate 420; the first electrode 444 can be electrically coupled to a second electrode defined by a second layer of conductive material 430 on the second side of the fabric substrate 420, such as by conductive thread or a metallic button passing through the fabric substrate 420 to form a via, as described above; the second electrode can contact the user's skin when the garment is worn, and the biometrics sensor can read a biometric signal from the user's skin via the second electrode.

In this implementation, the garment insert 410 can similarly be riveted onto, glued onto, buttoned into, or otherwise installed on or within the garment.

In another implementation, the garment insert 410 is ironed onto the garment in Block S250. In this implementation, the garment insert 410 can include a heat-activated fabric adhesive 480 applied across the first side of the fabric substrate 420 (and across the back side of the component carrier 440 opposite the fabric substrate 420), as shown in FIGS. 9 and 10B. The garment insert 410 can thus be arranged over the outside of the garment (e.g., on the outer layer) or on the inside of the garment (e.g., on the lining of the garment), and a clothes iron or other heated surface can then be applied over the second side of the fabric substrate 420 to activate the fabric adhesive, thereby adhering the garment insert 410 to the garment.

In the foregoing implementation, the garment insert 410 can further include a flexible heat shield 482 configured to shield the electrical component 444—mounted to the component carrier 440—from excess heat while the garment insert 410 is ironed onto the garment, as shown in FIGS. 9 and 10B. For example, the heat shield 482 can include a second sheet of aramid fibers, such as in the form of a flexible PCB, stitched or adhered over the second side of the fabric substrate 420 opposite the component carrier 440. In this example, the heat shield 482 can span the full height and width of the component carrier 440 or can span a smaller subregion of the component carrier 440 containing the electrical component 444. In a similar example, the heat shield 482 can be interposed between the component carrier 440 and the fabric substrate 420. Alternatively, the electrical component 444 can be encased in potting material on the component carrier 440, and the potting material can form a heat shield 482 to protect the electrical component 444 during excess heat. However, the garment insert 410 can include a heat shield 482 of any other material or form in order to protect the electrical component 444 from excess heat, which may damage the electrical component 444, when the garment insert 410 is ironed onto the garment. (In variations in which the garment insert 410 is stitched onto or into the garment, the garment insert 410 can similarly include a heat shield 482 arranged over the electrical component 444 and configured to shield the electrical component 444 from excess heat when the garment is ironed during laundering.)

In the variation in which the garment insert 410 includes a volume of conductive ink 460 interposed between the component carrier 440 and the fabric substrate 420, the conductive ink can be cured by heat output by the clothing iron when the garment insert 410 is ironed onto the garment. For example, heat from the clothes iron can evaporate solvent remaining in the conductive ink as the garment insert 410 is ironed onto the garment. Similarly, heat output by the clothes iron can sinter metal particles in the conductive ink, thereby forming a continuous conductive path between the electrode 444 on the fabric substrate 420 and the conductive interface pad 446 on the component carrier 440. For example, the conductive ink can include silver-alloy or copper-alloy particles of sizes sufficiently small to rapidly approach a glass or melting temperature when a heated clothes iron is moved across the garment insert 410 such that a portion of the silver-alloy or copper-alloy particles fuse.

Alternatively, the garment insert 410 can define a bond-ready "patch" supplied to a customer or to a user with heat-activated fabric adhesive 480 applied over one or both sides. Upon receipt of the garment insert 410, a customer may iron the garment insert 410 onto an existing garment, thereby integrating a "smart textile" circuit into the garment in a single step. Similarly, upon receipt of the garment insert 410, the customer may sew the garment insert 410 into the existing garment. However, the garment insert 410 can be incorporated or prepared for integration into a garment in any other way.

The systems and methods described herein can be embodied and/or implemented at least in part as a machine configured to receive a computer-readable medium storing computer-readable instructions. The instructions can be executed by computer-executable components integrated with the application, applet, host, server, network, website, communication service, communication interface, hardware/firmware/software elements of a user computer or mobile device, wristband, smartphone, or any suitable combination thereof. Other systems and methods of the embodiment can be embodied and/or implemented at least in part as a machine configured to receive a computer-readable medium storing computer-readable instructions. The instructions can be executed by computer-executable components integrated by computer-executable components integrated with apparatuses and networks of the type described above. The computer-readable medium can be stored on any suitable computer readable media such as RAMs, ROMs, flash memory, EEPROMs, optical devices (CD or DVD), hard drives, floppy drives, or any suitable device. The computer-executable component can be a processor but any suitable dedicated hardware device can (alternatively or additionally) execute the instructions.

As a person skilled in the art will recognize from the previous detailed description and from the figures and claims, modifications and changes can be made to the embodiments of the invention without departing from the scope of this invention as defined in the following claims.

We claim:

1. A method for fabricating a component of a flexible circuitry layer, comprising:
    applying a first mask to a first side of a textile, wherein the textile includes a layer of metallized material thereon, and wherein the applied first mask does not cover at least a first portion of the first side;
    applying a second mask to a second side of the textile, wherein the applied second mask does not cover at least a first portion of the second side, wherein the first portion of the second side is opposite the first portion of the first side; and
    applying a chemical to remove at least a portion of the layer of metallized material in the first portion of the first side.

2. The method of claim 1, further comprising applying a non-conductive hydrophobic coating across the first side of the fabric substrate and the second side of the fabric substrate.

3. The method of claim 1, wherein, after the chemical is applied, the remaining metallized material comprises circuit traces.

4. The method of claim 1, further comprising assembling a circuitry layer, including:
    attaching an electrical component to the textile; and
    attaching a power carrier to the textile.

5. The method of claim 4, further comprising incorporating the circuitry layer into a soft good product, wherein incorporating the circuitry layer into the soft good product includes:
    applying a heat-activated adhesive across the first side of the textile; arranging the circuitry layer across a region of the soft good product; and
    applying a heated surface to the second side of the textile to activate the heat-activated adhesive and to adhere the circuitry layer to the soft good product.

6. The method of claim 4, further comprising incorporating the circuitry layer into a soft good product, wherein incorporating the circuitry layer into the soft good product includes sewing the circuitry layer between an outer layer and a lining of the soft good product with an electrically-insulative thread.

7. The method of claim 1, further comprising cutting a piece of vinyl.

8. The method of claim 7, further comprising applying the cut piece of vinyl to the first side of the textile.

9. The method of claim 1, further comprising removing the first mask.

* * * * *